United States Patent
Eldredge et al.

(10) Patent No.: US 10,529,430 B2
(45) Date of Patent: *Jan. 7, 2020

(54) METHODS OF OPERATING A MEMORY DEVICE COMPARING INPUT DATA TO DATA STORED IN MEMORY CELLS COUPLED TO A DATA LINE

(71) Applicant: MICRON TECHNOLOGY, INC., Boise, ID (US)

(72) Inventors: Kenneth J. Eldredge, Boise, ID (US); Frankie F. Roohparvar, Monte Sereno, CA (US); Luca De Santis, Avezzano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 12 days.

This patent is subject to a terminal disclaimer.

(21) Appl. No.: 16/180,154

(22) Filed: Nov. 5, 2018

(65) Prior Publication Data

US 2019/0074069 A1 Mar. 7, 2019

Related U.S. Application Data

(60) Continuation of application No. 15/645,009, filed on Jul. 10, 2017, now Pat. No. 10,332,605, which is a
(Continued)

(51) Int. Cl.
*G11C 16/28* (2006.01)
*G11C 15/00* (2006.01)
(Continued)

(52) U.S. Cl.
CPC .............. *G11C 16/28* (2013.01); *G11C 15/00* (2013.01); *G11C 15/046* (2013.01); *G11C 16/0483* (2013.01)

(58) Field of Classification Search
CPC ..... G11C 16/0483; G11C 16/28; G11C 15/00; G11C 15/046
(Continued)

(56) References Cited

U.S. PATENT DOCUMENTS 6,456,528 B1 9/2002 Chen
6,493,790 B1 * 12/2002 Khieu ................. G06F 12/1027
365/189.07

(Continued)

*Primary Examiner* — Alfredo Bermudez Lozada
(74) *Attorney, Agent, or Firm* — Dicke, Billig & Czaja, PLLC

(57) ABSTRACT

Methods of operating a memory device include comparing input data to data stored in memory cells coupled to a data line, comparing a representation of a level of current in the data line to a reference, and determining that the input data potentially matches the data stored in the memory cells when the representation of the level of current in the data line is less than the reference. Methods of operating a memory device further include comparing input data to first data and to second data stored in memory cells coupled to a first data line or to a second data line, respectively, comparing representations of the levels of current in the first data line and in the second data line to a first reference and to a different second reference, and deeming one to be a closer match to the input data in response to results of the comparisons.

5 Claims, 8 Drawing Sheets

Related U.S. Application Data continuation of application No. 14/798,845, filed on Jul. 14, 2015, now Pat. No. 9,728,267, which is a division of application No. 13/864,659, filed on Apr. 17, 2013, now Pat. No. 9,105,330.

(60) Provisional application No. 61/625,286, filed on Apr. 17, 2012.

(51) Int. Cl.
*G11C 15/04* (2006.01)
*G11C 16/04* (2006.01)

(58) Field of Classification Search
USPC .............................. 365/49.17, 49.1, 185.17
See application file for complete search history.

(56) References Cited

U.S. PATENT DOCUMENTS

| | | |
|---|---|---|
| 6,731,542 B1 | 5/2004 | Le et al. |
| 7,535,764 B2 | 5/2009 | Chin et al. |
| 2008/0158967 A1* | 7/2008 | Mokhlesi ............ G11C 11/5642 365/185.17 |
| 2008/0273388 A1* | 11/2008 | Chin .................. G11C 11/5628 365/185.17 |
| 2009/0190404 A1* | 7/2009 | Roohparvar ......... G11C 15/046 365/185.17 |

* cited by examiner

| INPUT (b) | STORED DATA (a) | OUTPUT |
|---|---|---|
| 0 | 10 X F | 0110 |
| 1 | 10 X F | 1010 |
| X | 10 X F | 1110 |
| F | 10 X F | 0000 |

STATE DEFINITIONS

INPUT DATA b    d    d*

$\emptyset$ = L(0)  H(1)

1 = H    L

X = L    L

F = H    H (PASS THROUGH)

STORED DATA a    z    z*

$\emptyset$ = L(0)  H(1)

1 = H    L

X = H    H

F = L    L (ERASED STATE)

FIG. 1C

METHODS OF OPERATING A MEMORY DEVICE COMPARING INPUT DATA TO DATA STORED IN MEMORY CELLS COUPLED TO A DATA LINE

RELATED APPLICATIONS

This application is a continuation of U.S. patent application Ser. No. 15/645,009, titled "METHODS OF OPERATING A MEMORY DEVICE COMPARING INPUT DATA TO DATA STORED IN MEMORY CELLS COUPLED TO A DATA LINE," filed Jul. 10, 2017 (pending), which is a continuation of U.S. patent application Ser. No. 14/798,845, titled "MEMORY DEVICES CONFIGURED TO APPLY DIFFERENT WEIGHTS TO DIFFERENT STRINGS OF MEMORY CELLS COUPLED TO A DATA LINE AND METHODS," filed Jul. 14, 2015, now U.S. Pat. No. 9,728,267 issued Aug. 8, 2017, which is divisional of U.S. patent application Ser. No. 13/864,659, titled "MEMORY DEVICES CONFIGURED TO APPLY DIFFERENT WEIGHTS TO DIFFERENT STRINGS OF MEMORY CELLS COUPLED TO A DATA LINE AND METHODS," filed Apr. 17, 2013, now U.S. Pat. No. 9,105,330 issued Aug. 11, 2015, which is commonly assigned and incorporated herein by reference in its entirety and which claims priority to U.S. Provisional Patent Application Ser. No. 61/625,286, filed Apr. 17, 2012, titled "MEMORY DEVICES CONFIGURED TO APPLY DIFFERENT WEIGHTS TO DIFFERENT STRINGS OF MEMORY CELLS COUPLED TO A DATA LINE AND METHODS," which is incorporated herein by reference in its entirety, and is related to U.S. patent application Ser. No. 13/449,082, titled "METHODS AND APPARATUS FOR PATTERN MATCHING," filed Apr. 17, 2012, which claims priority to U.S. Provisional Patent Application Ser. No. 61/476,574, titled "METHODS AND APPARATUS FOR PATTERN MATCHING," filed Apr. 18, 2011.

FIELD

The present disclosure relates generally to memory devices and in particular the present disclosure relates to memory devices configured to apply different weights to different strings of memory cells coupled to a data line and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage structures, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory may utilize architectures known as NOR flash and NAND flash. The designation is derived from the logic used to read the devices. In a NOR flash architecture, a column of memory cells are coupled in parallel with each memory cell coupled to a data line, such as a bit line. A "column" refers to a group of memory cells that are commonly coupled to a data line, such as a bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

Content addressable memories (CAM) are memories that implement a lookup table function in a single clock cycle. They use dedicated comparison circuitry to perform the lookups. CAM applications are often used in network routers for packet forwarding and the like. Each individual memory cell in a CAM usually requires its own comparison circuit in order to allow the CAM to detect a match between a bit of input data, such as an input feature vector (e.g., sometimes referred to as a key or key data) with a bit of data, such as a data feature vector, stored in the CAM. However, not all bits are the same. For example, binary expressions may include a most significant bit (MSB), a least significant bit (LSB), and bits between the MSB and LSB.

For the reasons stated above, and for other reasons stated below which will become apparent to those skilled in the art upon reading and understanding the present specification, there is a need in the art for identifying and differentiating between MSBs, LSBs and bits between the MSB and LSB in comparisons between input data and data stored in memory.

BRIEF DESCRIPTION OF THE DRAWINGS

FIG. 1C shows a logical truth table and state definitions in accordance with the embodiment of FIG. 1B.

DETAILED DESCRIPTION

Figure 1A:
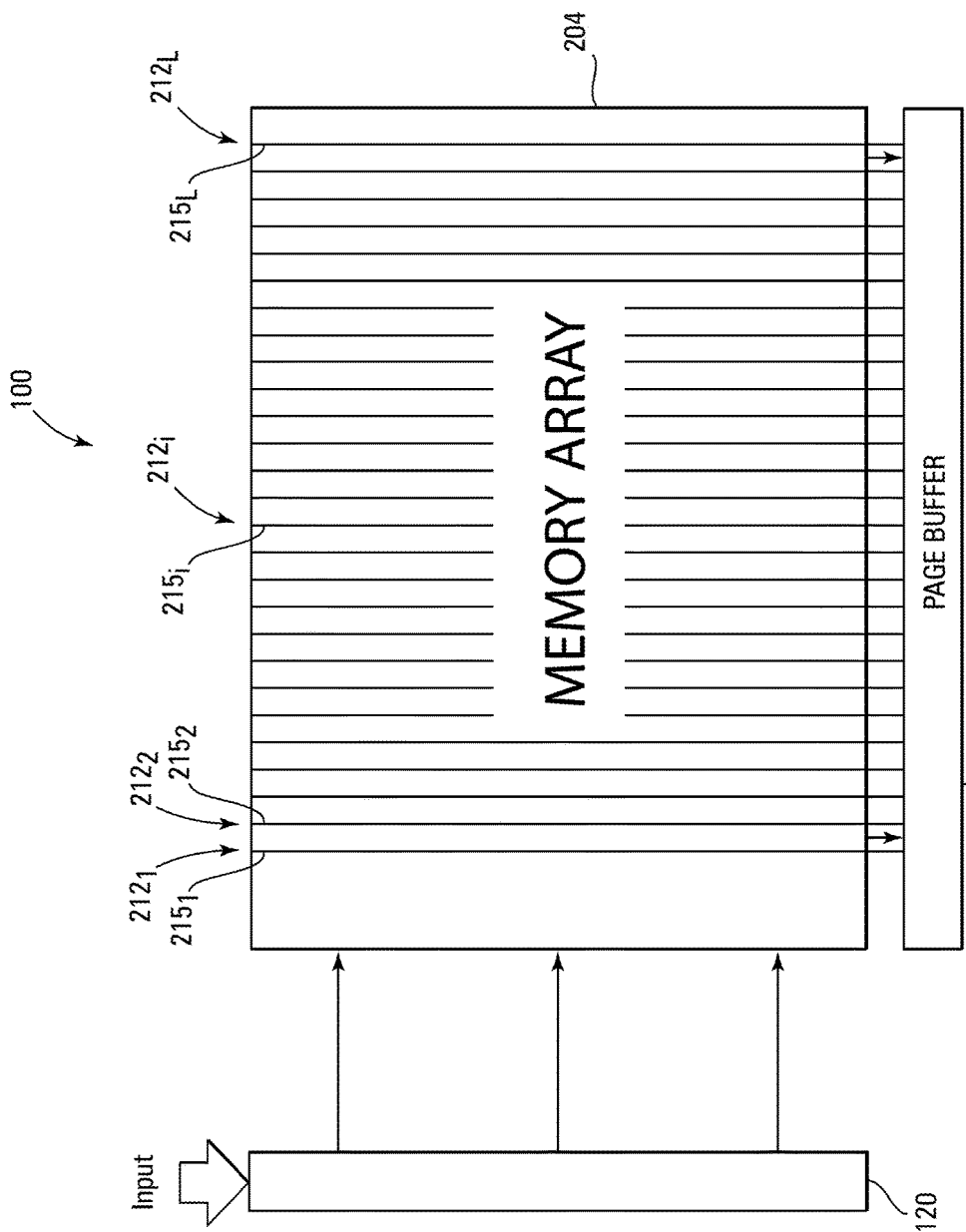
FIG. 1A is a simplified block diagram of a memory device, according to an embodiment.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

FIG. 1A is a block diagram of a memory device 100, e.g., a NAND, NOR, CAM memory device, etc. Memory device 100 may include a memory array 204. Memory array 204 may be organized into columns 212 of memory cells, such as columns $212_1$ to $212_L$, that may be respectively accessed by data lines (e.g., bit lines $215_1$ to $215_L$). A page buffer 110 may be coupled to bit lines 215. An input buffer 120 may also be coupled to memory array 204. The input buffer 120 can be used to temporarily store input data (e.g., an input feature vector), such as key data, for comparison (e.g., during a read operation performed on array 104) to data stored in memory array 104. Data stored in each column 212 of memory array 204 can be referred to as a data feature vector.

For example, the data feature vectors stored in columns 212 of memory array 104 may correspond to known entities, such as known patterns, and memory device 100 may be configured to determine whether an input feature vector at least partially matches a particular known entity represented by a data feature vector, thereby at least potentially identifying the input feature vector as being the particular known entity.

Memory device 100 may be configured to identify the input feature vector as being a particular known entity in response to determining that the input feature vector potentially matches the data feature vector representing the particular known entity. For example, memory device 100 may be configured to identify the data feature vectors most likely to match the input feature vector based on how closely the data feature vectors match the input feature vector.

Components of the input feature vector correspond to certain features (e.g., attributes) of the input feature vector, and thus the entity represented by the input feature vector. Similarly, components of the data feature vectors correspond to certain features (e.g., attributes) of the data feature vectors, and thus the entities represented by the data feature vectors. For example, each data feature vector and the input feature vector may be a pattern, such as of a person's face, fingerprint, etc., and the components may be the features of that pattern.

Components of the input feature vector may be compared to like components of the data feature vectors to determine which data feature vectors potentially match the input feature vector, thereby identifying the entity represented by the input feature vector. For some embodiments, an input feature vector may be determined to potentially match a data feature vector even though there might be a mismatch of certain components.

Figure 1B:
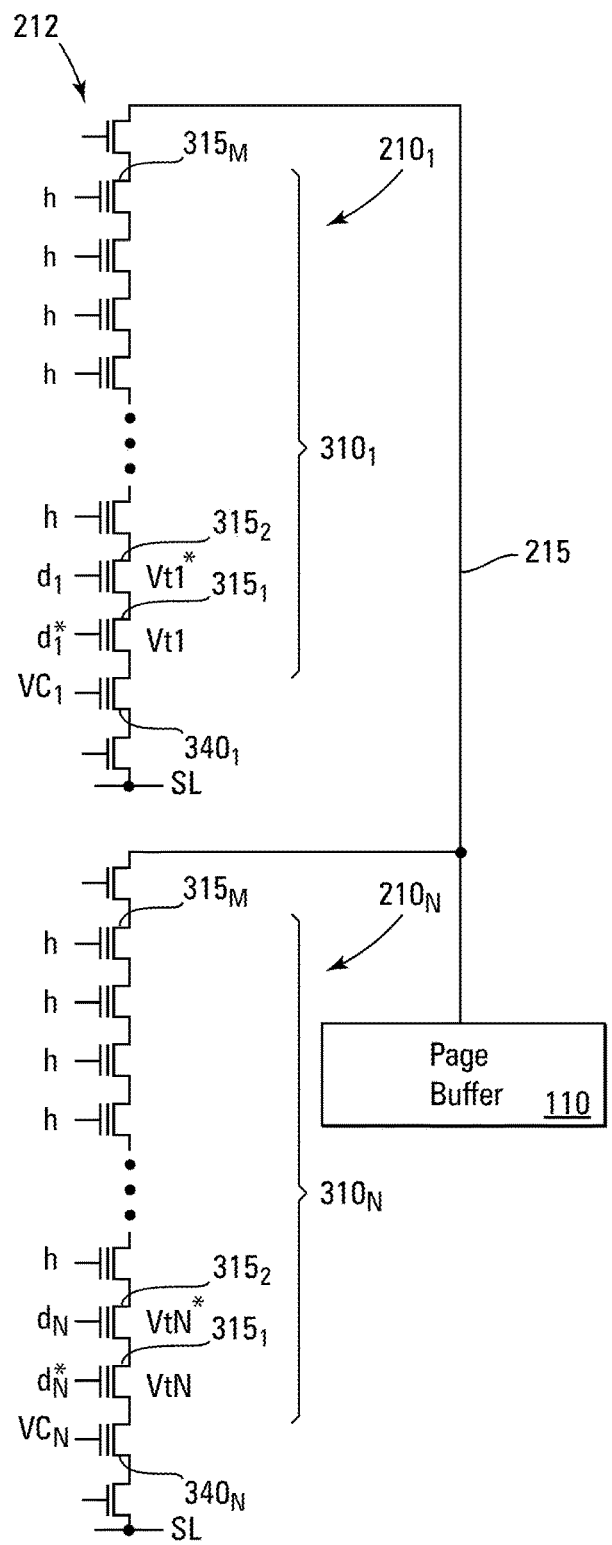
FIG. 1B is a schematic of a column of a memory array, according to another embodiment.

FIG. 1B illustrates an example of a column 212 of memory array 204, e.g., configured according to the NAND architecture. Column 212 comprises N strings (e.g., NAND strings) $310_1$ to $310_N$ of series-coupled memory cells 315. One end of each of strings $310_1$ to $310_N$ is coupled to the same bit line 215 that is coupled in turn to page buffer 110. The opposite end of each of strings $310_1$ to $310_N$ is coupled to a source line SL. The bit line 215 acts as a summing node for the outputs from of each of strings $310_1$ to $310_N$. For some embodiments, strings $310_1$ to $310_N$ may be respectively blocks $210_1$ to $210_N$ of memory cells 315.

The h signals in FIG. 1B can be a pass signals. In an embodiment, the pass signal h has a voltage level high enough (e.g., about 4V in a particular embodiment) to operate a memory cell having its control gate coupled thereto as a pass-transistor, regardless of the programmed Vt of the memory cell. According to an embodiment, pass signals h might be applied to control gates of unselected memory cells of a string of memory cells (e.g., those memory cells corresponding to the at least a portion of a value of a feature not then being compared) to operate them as pass-transistors.

Memory cells $315_1$ and $315_2$ may be viewed as switches that selectively allow current to flow from a respective string 310 to bit line 215, or vice versa, when the remaining memory cells in the respective string are operating as pass-transistors. A mismatch between a component of a data feature vector stored in a string 310 and a like component of an input feature vector results in current flow in that string 310.

Resistors $340_1$ and $340_N$ are respectively coupled in series with strings $310_1$ and $310_N$ and respectively control the analog value of current through strings $310_1$ and $310_N$. For example, resistors $340_1$ and $340_N$ may act as constant current sources of varying values.

The current value through a string can be set by setting the resistance of the respective resistor 340. For example, the resistance of a resistor 340 can be set by programming the threshold voltage of the resistor 340, setting the channel length of the resistor 340 to a specific value, setting the voltage VC applied to the control gate of the resistor 340 to a specific value, etc. Multiple resistors 340 may be in series for additional control (compensation) if appropriate.

The ratio of current may be binary. For example, for a unit of current through string $310_1$, the currents through strings $310_2$ to $310_N$ might respectively be ½ to $½^{N-1}$ of a unit, where N is the block (e.g. string number), e.g., starting at 1. The string corresponding to the most significant bit, e.g., string $310_1$, may have a weight of 1 and a unit current in the event of a mismatch, and the string corresponding to the least significant bit, e.g., string $310_N$, may have the smallest weight, e.g., $½^{N-1}$, and a current of $½^{N-1}$ of a unit in the event of a mismatch.

In an example, a feature $A1=(a_1, a_2, a_3, a_4, \ldots, a_N)$ of a data feature vector may be programmed as 1011, e.g., for N=4. A feature $B1=(b_1, b_2, b_3, b_4, \ldots, b_N)$ of an input feature vector may be input as 1010, e.g., for N=4, for comparison to feature A1. Since a mismatch occurs in the fourth significant bit, corresponding to the least significant bit in this case, the value of the current flow will be $½^{(4-1)}=⅛$ of a unit. This may be referred to as the least significant bit value of current. Note that bits $a_1$ through $a_N$ may be respectively stored in blocks $210_1$ through $210_N$ (e.g., strings $310_1$ through $310_N$) for some embodiments.

A feature $B1=(b_1, b_2, b_3, b_4, \ldots, b_N)$ of an input feature vector may input as 0011 for comparison to feature A1. Since a mismatch occurs in the first significant bit, corresponding to the most significant bit in this case, the value of the current flow will be the most significant bit value of current $\frac{1}{2}^{(1-1)}=1$ unit.

For some embodiments, the input feature vector can be made up of multiple features (e.g., components of the input feature vector), e.g., IF(B)=(B1, B2, B3, . . . , BN) and each data feature vector can be made up of multiple features (e.g., components of the data feature vectors), e.g., DF(A)=(A1, A2, A3, . . . , AN)

The page buffer 110 may measure the analog current flow in bit line 215. For example, zero current is due to an exact match, and the smallest amount of current is due to a single feature mismatch, e.g., a least significant bit mismatch. A current of weight one results from a most significant bit mismatch. All mismatches in a column may be summed in an analog fashion. The threshold value of what current constitutes a match can be programmable.

In FIG. 1B, the bit values corresponding voltage signals applied to the control gates of memory cells $315_1$ and $315_2$ are respectively represented by d* and d, where d* is the complement of d and represents not d (e.g., see input data in the state definitions in FIG. 1C). In fact, a superscript * is used herein to denote a complement.

For example, if a corresponding digit of data of a received input feature vector has a binary bit value of b=0, a voltage of about 2V, corresponding to a bit value of $d_1$=0, may be applied to the control gate of memory cell $315_2$ of string $310_1$, and a voltage of about 4V, corresponding to a bit value of $d_1$*=1, may be applied to the control gate of memory cell $315_1$ of string $310_1$. That is, $d_1$*=1 and $d_1$=0 may correspond to a binary bit value of b=0 of a digit of data of the input feature vector, as shown in FIG. 1C. If a corresponding digit of data of a received input feature vector has a binary bit value of b=1, a voltage of about 4V, corresponding to a bit value of $d_1$=1, may be applied to the control gate of memory cell $315_2$ of string $310_1$, and a voltage of about 2V, corresponding to a bit value of $d_1$*=0, may be applied to the control gate of memory cell $315_1$ of string $310_1$. That is, $d_1$*=0 and $d_1$=1 may correspond to a binary value of b=1 of a digit of data of the input feature vector, as shown in FIG. 1C.

Memory cells $315_1$ and $315_2$ of string $310_1$ might be respectively programmed to threshold voltages Vt1 and Vt1* to store at least a portion of a value of a feature of the data feature vector stored in string $310_1$. For example, memory cells $315_1$ and $315_2$ of string $310_1$ might be respectively programmed to threshold voltages Vt1 and Vt1* of about 1V and about 3V to store a binary value of a=0 for a digit of data of the stored data feature vector. For example, when memory cell $315_1$ is programmed to a threshold voltage Vt1 of about 1V, memory cell $315_1$ may store a bit value of z=0, and when memory cell $315_2$ is programmed to a threshold voltage Vt1* of about 3V, memory cell $315_2$ may store a bit value of z*=1. This means that when memory cells $315_1$ and $315_2$ respectively store bit values of z=0 and z*=1, memory-cell pair $315_1$, $315_2$ stores a binary value of a=0, as shown in FIG. 1C.

Memory cells $315_1$ and $315_2$ of string $310_1$ might be respectively programmed to threshold voltages Vt1 and Vt1* of about 3V and about 1V to store a binary value of a=1 for the digit of data of the data feature vector. For example, when memory cell $315_1$ is programmed to a threshold voltage Vt1 of about 3V, memory cell $315_1$ may store a bit value of z=1, and when memory cell $315_2$ is programmed to a threshold voltage Vt1* of about 1V, memory cell $315_2$ may store a bit value of z*=0. This means that when memory cells $315_1$ and $315_2$ respectively store bit values of z=1 and z*=0, memory-cell pair $315_1$, $315_2$ stores a binary value of a=1, as shown in FIG. 1C. Similarly, memory cells $315_1$ and $315_2$ of string $310_N$ might be respectively programmed to threshold voltages VtN and VtN* to store at least a portion of a value of a feature of the data feature vector stored in string $310_N$.

The logic truth table of FIG. 1C illustrates the results from comparing a digit b of input data, such as of a feature (e.g., component) B of an input feature vector, to a digit a of corresponding stored data, such as of a same feature (e.g., component) A of a stored data feature vector. With additional reference to FIG. 1B, for example, during a compare operation of an input data to stored data, for a digit a, signals, corresponding to the bit values d* and d, are respectively applied to the control gates of the memory cells $315_1$ and $315_2$ of string $310_1$.

If the voltage of the signal corresponding to the respective d*/d bit value is greater than the programmed threshold voltage (e.g., Vt* or Vt) of the respective memory cell (e.g., $315_1$ and $315_2$), the respective memory cell will conduct, e.g., and will be ON. If the voltage of the signal corresponding to the respective d*/d bit value is less than the programmed threshold voltage (e.g., Vt* or Vt) of the respective memory cell (e.g., $315_1$ and $315_2$), the respective memory cell will not conduct, e.g., and will be OFF. According to an embodiment implementing the truth table of FIG. 1C, if the value of digit b matches the value of digit a, at least one of the memory cells (e.g., $315_1$ and $315_2$) will not conduct, e.g., and will be OFF, in response to receiving the signals corresponding to the bit values d* and d selected in accordance with the value of digit b.

Referring to FIG. 1C, the first column includes three possible values (binary 0, binary 1, and X) for digit b. For a particular digit b, for example, signals corresponding to the bit values d* and d, selected in accordance with the value of digit b, can be applied to the control gates of a corresponding pair of memory cells (e.g., memory cells $315_1$ and $315_2$ of string $310_1$). For example, if the digit b has a value of binary 0, a signal having a voltage level of about 4V, e.g., corresponding to a bit value $d_1$*=1, might be applied to the control gate of a first memory cell (e.g., memory cell $315_1$) of the pair, and a signal having a voltage level of about 2V, e.g., corresponding to a bit value $d_1$=0, might be applied to the control gate of a second memory cell of the pair (e.g., memory cell $315_2$).

Continuing with such an example, if the digit b has a value of binary 1, a signal having a voltage level of about 2V, e.g., corresponding to a bit value $d_1$*=0, might be applied to the control gate of the first memory cell (e.g., memory cell $315_1$) of the pair, and a signal having a voltage level of about 4V, e.g., corresponding to a bit value $d_1$=1, might be applied to the control gate of a second memory cell of the pair (e.g., memory cell $315_2$).

Further continuing with the example, if do not care data X has been inserted into the digit d, a signal having a voltage level of about 0V might be applied to the control gate of the first memory cell (e.g., memory cell $315_1$) of the pair, and a signal having a voltage level of about 0V might also be applied to the control gate of the second memory cell of the pair (e.g., memory cell memory cell $315_2$), thus ensuring neither cell of the pair conducts, assuring a match no matter what actual data is stored by the pair of cells.

The F entry in the first column of FIG. 1C corresponds to an operation corresponding to memory cells in a pass-through mode, such as where their control gates are both biased with the pass through signal h (e.g., allowing other digits to be compared).

Each row of the second column of FIG. 1C illustrates four possible values for digit a (i.e., the digit of data being compared to the digit b). For a particular digit a, for example, a pair of memory cells can be programmed to threshold voltages (e.g., Vt1, Vt1*, corresponding to stored bit values z and z*) selected in accordance with the value of digit a.

For example, if the digit a has a value of binary 0, a first memory cell (e.g., memory cell $315_1$ of string $310_1$) of the pair might be programmed to a threshold voltage (e.g., Vt1) of about 1V, while the second memory cell of the pair (e.g., memory cell $315_2$ of string $310_1$) might be programmed to a threshold voltage (e.g., Vt1*) of about 3V. Continuing with such an example, if the digit a has a value of binary 1, a first memory cell (e.g., memory cell $315_1$ of string $310_1$) of the pair might be programmed to a threshold voltage (e.g., Vt1) of about 3V, while the second memory cell of the pair (e.g., memory cell $315_2$ of string $310_1$) might be programmed to a threshold voltage (e.g., Vt1*) of about 1V.

Further continuing with the example, to store do not care data X for digit a, a first memory cell (e.g., memory cell $315_1$ of string $310_1$) of the pair might be programmed to a threshold voltage (e.g., Vt1) of about 3V, and the second memory cell of the pair (e.g., memory cell $315_2$ of string $310_1$) might also be programmed to a threshold voltage (e.g., Vt1*) of about 3V, thus ensuring that at least one cell of the pair does not conduct regardless of the selected the voltage of the signal corresponding to the respective d*/d bit value, and thereby assuring a match regardless of the value of digit b. Still further, in a another variation, the memory cells have not been programmed to store either a binary 0, a binary 1, or do not care data X (e.g., they both have a threshold voltage of about 1V), in which case a match with digit b is only detected if do not care data has been inserted into digit b.

Each row of the third column of FIG. 1C illustrates a respective result of comparing the value of digit b to each of the four possible values for digit a. A binary 1 indicates no current conduction on the bit line coupled to the string. A binary 0 indicates that current is flowing. Thus, referring to the first row of the third column of FIG. 1C, when digit b has a value of binary 0 and the corresponding pair of memory cells store a binary 1, the result is binary 0—indicating a no match condition. When the digit b has a value of binary 0 and the corresponding pair of memory cells store a binary 0, the result is binary 1—indicating a match condition. When the digit b has a value of binary 0 and the corresponding pair of memory cells store do-not-care data X, the result is binary 1—indicating a match condition. When the digit b has a value of binary 0 and the pair of memory cells is erased F, the result is 0—indicating a no match condition.

FIG. 1C also includes examples of state definitions from the logic truth table. The input the bit values d and d*, selected in accordance with the value of digit b, have the illustrated logic highs H (logic 1) and logic lows L (logic 0) as indicated. The memory array stores z and z*, selected in accordance with the value of digit a, having the illustrated logic highs H and logic lows L as indicated.

Figure 2:
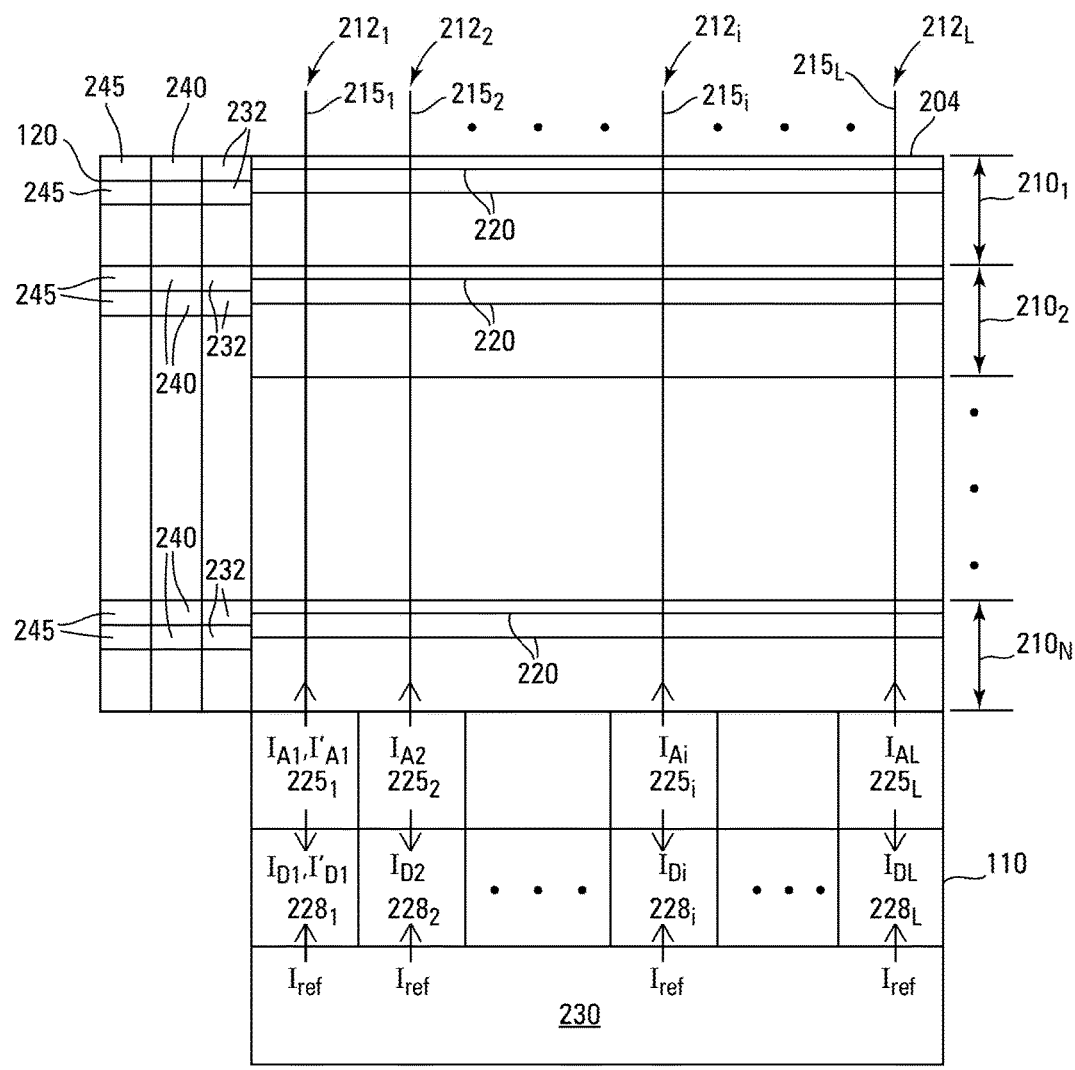
FIG. 2 is a block diagram that illustrates a portion of a memory device, according to another embodiment.

FIG. 2 is a block diagram that illustrates a portion of memory device 100 that includes memory array 204, page buffer 110, and input buffer 120. For some embodiments, memory array 204 may be organized in blocks 210 of memory cells, such as blocks $210_1$ to $210_N$.

Each column 212 may include memory cells from each of blocks 210. Each block 210 may include access lines (e.g., word lines 220) respectively coupled to rows of memory cells in each block 210 so that each block 210 is organized in rows and columns of memory cells.

Bit lines $215_1$ to $215_L$ may be respectively coupled, one-to-one, to current sense amplifiers, such as sense amps $225_1$ to $225_L$ that may have analog-to-digital converter functionality. Sense amps $225_1$ to $225_L$ may be respectively coupled, one-to-one, to comparators $228_1$ to $228_L$. A single register 230 (e.g., that may be referred to as difference register), in some embodiments, may be coupled to comparators $228_1$ to $228_L$. Sense amps 225, comparators 228, and register 230 may be part of page buffer 110 for some embodiments. For other embodiments, there may be a plurality of individual difference registers, where the individual difference registers are coupled one-to-one to comparators $228_1$ to $228_L$.

Word lines 220 may be coupled to respective ones of drivers 232 for receiving voltages therefrom. Mask registers 240 may be coupled to drivers 232, and may be used to mask certain blocks 210 or certain cells of blocks 210 when reading from or writing to array 204. For example, mask registers 240 may be coupled one-to-one to word lines 220. Drivers 232 and mask register 240 may be part of input buffer 120 for some embodiments. In other words, mask registers 240 may mask memory cells coupled thereto. For example, a mask register 240 may store a mask bit that causes a memory cell coupled thereto to be masked.

Input (e.g., key) registers 245 (e.g., which may also be referred to as input feature registers) may be coupled one-to-one to mask registers 240, and thus to word lines 220, and may be part of input buffer 120 for some embodiments. For other embodiments, the input feature registers 245 and mask registers 240 may be interchanged so that input feature registers 245 are between mask registers 240 and drivers 232.

Note that the set of input feature registers receive input data, such as input feature vectors, for comparison to data, such as data feature vectors, stored in columns 212 of memory array 204. For example, an input feature vector may be programmed into resisters 245.

Each component of a data feature vector may be stored in one or more blocks 210. For some embodiments, multiple components of a data feature vector may be stored in a single block. For other embodiments, components for multiple data feature vectors may be stored in a single block.

Each feature (e.g., component) of a feature vector may be expressed by a binary expression of data having a most significant bit, a least significant bit, and bits of differing significance between the most significant bit and the least significant bit, where bits of the input feature vector are compared to bits of each data feature vector having like significance. For example, the most significant bit of the input feature vector may be compared to the most significant bit of a data feature vector, the least significant bit of the input feature vector to the least significant bit of the data feature vector, etc. The bits of a feature (e.g., component) of a data feature vector may be respectively stored in different blocks 210 of a group of blocks 210; the bits of another feature (e.g., component) of the data feature vector may be respectively stored in different blocks 210 of another group of blocks 210; etc.

For some embodiments, more than one bit of a component of a data feature vector can be stored in a single block. For example, multiple bits for a single component of a data feature vector can be stored in a single block. In addition, bits for multiple components of a data feature vector can be stored in a single block.

For some embodiments, each sense amp 225 may sense a level of a current $I_A$ on a respective one of bit lines 215 and may convert the sensed current level $I_A$ to a digital representation $I_D$ (e.g., a voltage level representing a sensed current level) of the level of the sensed current $I_A$. Each sense amp 225 may send the representation $I_D$ to a respective comparator 228.

Register 230 may store a particular reference $I_{ref}$ (e.g., a voltage level) to be compared to the representation $I_D$ at the respective comparator 228. That is, the respective comparator 228 may receive the particular reference $I_{ref}$ from register 230 and compare the particular reference $I_{ref}$ to the representation $I_D$. For example, comparator $228_1$ may receive the particular reference $I_{ref}$ from register 230 and compare the particular reference $I_{ref}$ to representation $I_{D1}$ that is a digital representation of the level of the sensed current $I_{A1}$ on bit line $215_1$; comparator $228_2$ may receive the particular reference $I_{ref}$ from register 230 and compare the particular reference $I_{ref}$ to representation $I_{D2}$ that is a digital representation of the level of the sensed current $I_{A2}$ on bit line $215_2$; and so on, until comparator $228_L$ receives the particular reference $I_{ref}$ from register 230 and compares the particular reference $I_{ref}$ to representation $I_{DL}$ that is a digital representation of the level of the sensed current $I_{AL}$ on bit line $215_L$.

For some embodiments, a representation $I_D$ that is less than or equal to the particular reference $I_{ref}$ may be indicative of a potential match, between data (e.g., a data feature vector) stored in a respective column 212 and input data (e.g., an input feature vector) stored in registers 245, and a representation $I_D$ that is greater than the particular reference $I_{ref}$ may be indicative of no match between the data stored in the respective column 212 and the data stored in registers 245. For example, memory device 100 may be configured to determine that there is a potential match in response to the representation $I_D$ being less than or equal to the particular reference $I_{ref}$ and no match in response to the representation $I_D$ being greater than the particular reference $I_{ref}$. For example, if the representation $I_{D1}$ is less than or equal to the particular reference $I_{ref}$, the input feature vector is potentially an exact match to the data feature vector stored in column $212_1$, and if the number $I_{D2}$ is less than or equal to the particular reference $I_{ref}$, the input feature vector is potentially an exact match to the data feature vector stored in column $212_2$, whereas if the representation $I_{DL}$ is greater than the particular reference $I_{ref}$, the input feature vector is not a potential match to the data feature vector stored in column $212_L$.

For other embodiments, to vary the number of potential matches and/or to identify data feature vectors that may have a greater or lesser potential of matching the input feature vector, register 230 may be programmable so that a user, for example, can program different particular references $I_{ref}$ into register 230. For example, larger particular references $I_{ref}$ can potentially identify a larger number of data feature vectors that potentially match the input feature vector than smaller particular references $I_{ref}$, in that the larger particular reference $I_{ref}$ allows for data feature vectors that are further away from matching the input feature vector than the smaller particular references $I_{ref}$. For example, larger particular references $I_{ref}$ may be used when a smaller reference $I_{ref}$ yields little or no data feature vectors potentially matching the input feature vector. Conversely, if there are too many data feature vectors potentially matching the input feature vector, the particular reference $I_{ref}$ may be reduced, in that the smaller particular reference $I_{ref}$ requires data feature vectors potentially matching the input feature vector to be closer to the input feature vector than a larger value of the particular reference $I_{ref}$.

For some embodiments, progressively reducing the particular reference $I_{ref}$ can act to identify the data feature vectors that are closest to the input feature vector. For other embodiments, setting the particular reference $I_{ref}$ to zero identifies data feature vectors that are an exact match to the input feature vector.

The level of a current $I_A$ on a respective one of bit lines 215 might not be zero, in that there may be some current leakage through a memory cell that is turned off, and thus though the string containing that memory cell and the bit line 215 coupled to that string. Therefore, the digital representation $I_D$ that is compared to $I_{ref}$ might not be zero. Therefore, to compensate for such leakage, $I_{ref}$ may be set to a certain value, e.g., corresponding to a predetermined current leakage that may occur, for some embodiments. Then, for some embodiments, if digital representation $I_D$ is less than or equal to the certain value, digital representation $I_D$ is taken to be zero. As such, register 230 is configured to store a value of $I_{ref}$ that compensates for current leakage.

Figure 3:
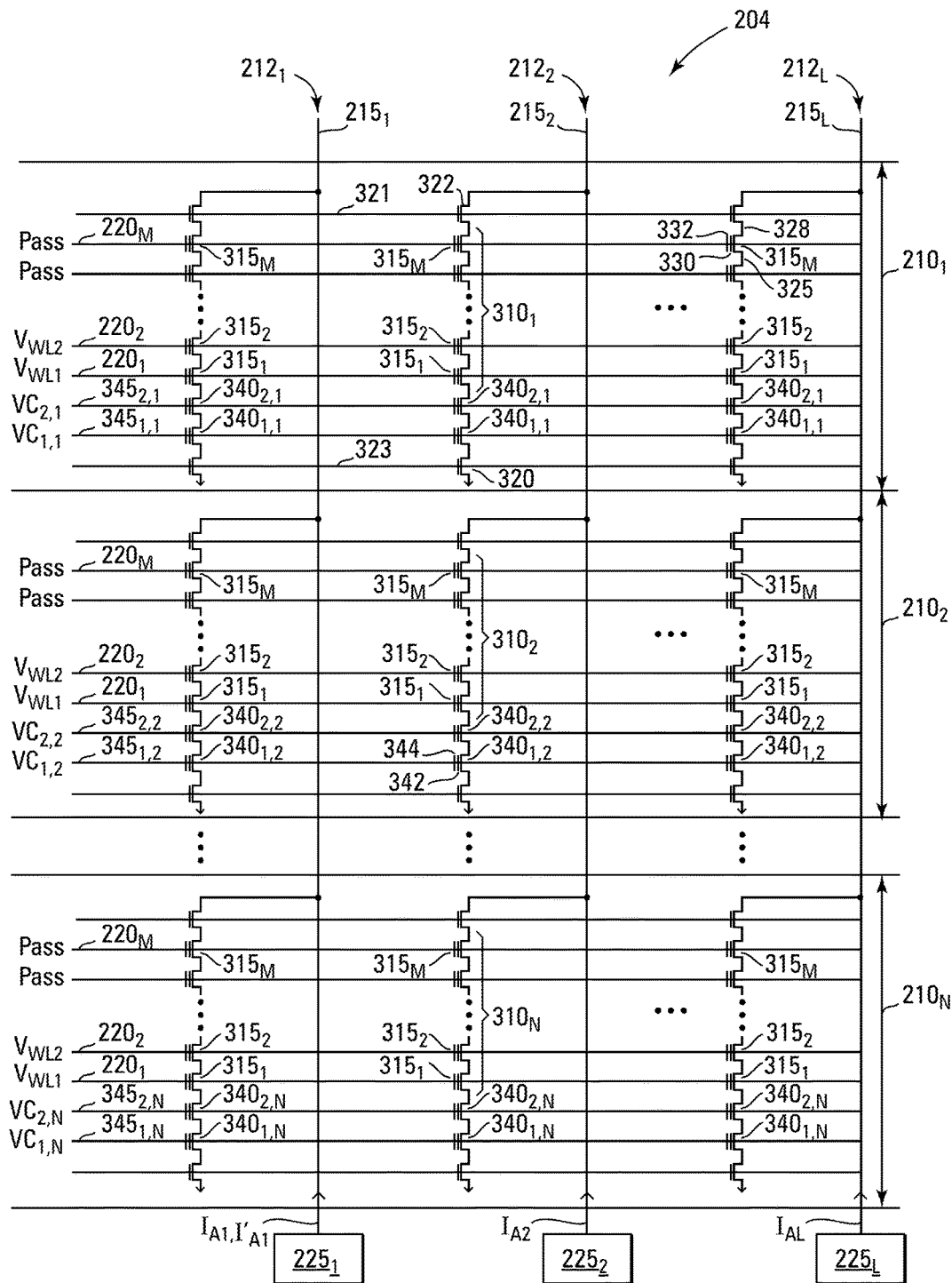
FIG. 3 is a schematic of a memory array, according to another embodiment.

FIG. 3 is a schematic of array 204, e.g., a NAND array. Each bit line 215 may be coupled to a plurality strings 310 (e.g., strings $310_1$ to $310_N$ respectively of blocks $210_1$ to $210_N$) of memory cells $315_1$ to $315_M$. The memory cells 315 may represent non-volatile memory cells for storage of data. The memory cells 315 of each string 310 are connected in series, source to drain, between a source select gate 320 and a drain select gate 322. Therefore, a column 212 of memory cells 315 may include a plurality of strings 310 coupled to a given bit line 215. Each drain select gate 322 selectively couples an end of a corresponding string 310 to a corresponding bit line 215. Drain select gates 322 may be commonly coupled to a drain select line 321, and source select gates 320 may be commonly coupled to a source select line 323.

Typical construction of a memory cell 315 may include a source 325, a drain 328, a charge-storage structure 330 (e.g., a floating gate, charge trap, etc.) that can store a charge that determines a data value of the cell, and a control gate 332, as shown in FIG. 3. Memory cells 315 have their control gates 332 respectively coupled to (and in some cases form) word lines 220. For example, in each of blocks $210_1$ to $210_N$, memory cells $315_1$ to $315_M$ may have their control gates 332 respectively coupled to (and in some cases from) word lines $220_1$ to $220_M$. A row of the memory cells 315 may be those memory cells commonly coupled to a given word line 220.

A resistor (e.g., one or more resistors) 340 may be coupled in series with each string 310 of memory cells 315. For example, one or more resistors 340 may be between and coupled in series with a source select gate 320 and a memory cell $315_1$ located at an end of a respective string 310 that is opposite the end coupled to a drain select gate 322. Each source select gate 320 may selectively couple a resistor 340, and thus a respective string 310, to a source line (not shown). Although two series-coupled resistors 340 are shown in FIG. 3, one resistor 340 may be coupled in series with each string 310, or more than two series-coupled resistors 340 may be coupled in series with each string 310 for more control over the resistance. For example, the more resistors 340 coupled in series with a string 310, the more control over the resistance on that string.

For embodiments where more than one resistor 340 is coupled to a string 310, the resistances of the respective resistors may be same as each other or different than each other. In the example of FIG. 3, each string $310_1$ in block $210_1$ may be coupled to resistors $340_{1,1}$ and $340_{2,1}$; each string $310_2$ in block $210_2$ may be coupled to resistors $340_{1,2}$ and $340_{2,2}$; and . . . each string $310_N$ in block $210_N$ may be coupled to resistors $340_{1,N}$ and $340_{2,N}$.

The overall resistance of the one or more resistors 340 coupled to each string $310_1$ in block $210_1$ may be different than the overall resistance of the one or more resistors 340 coupled to each string $310_2$ in block $210_2$, and the overall resistance of the one or more resistors 340 coupled to each string $310_2$ in block $210_2$ may be different than the overall resistance of the one or more resistors 340 coupled to each string $310_N$ in block $210_N$. For example, for some embodiments, the overall resistance of the one or more resistors 340 coupled to each string in each block 210 may be different than the overall resistance of the one or more resistors 340 coupled to each string 310 in every other block 210.

The one or more resistors 340 respectively coupled in series with strings $310_1$, $310_2$, and . . . $310_N$ respectively cause different levels of current to flow through strings $310_1$, $310_2$, and . . . $310_N$, e.g., when strings $310_1$, $310_2$, and . . . $310_N$ are discharged from a common voltage level to ground. For example, the strings may be discharged through an activated source select gate 320 to a source line that may be coupled to ground.

The one or more resistors 340 coupled to each string 310 act to weight the respective string 310. Accordingly, differently weighted strings $310_1$ to $310_N$ make different contributions to the overall level of the current flowing through a precharged bit line 215 coupled to and discharging through the differently weighted strings $310_1$ to $310_N$. This allows the bits of data respectively stored in the memory cells 315 of strings $310_1$ to $310_N$ to be weighted differently. For example, the bits of data respectively stored in the memory cells 315 of strings $310_1$ to $310_N$ can be weighted according to their significance.

For example, for some embodiments, strings $310_1$ to $310_N$ may be respectively coupled to increasing resistances, and the memory cells of strings $310_1$ to $310_N$ may respectively store most significant bits to least significant bits. In other words, the lower the resistance coupled to a given string, the higher the potential current flow through that string and the higher the significance of the bits of data stored in the memory cells of that string. For some embodiments, each string $310_1$ may be coupled to the lowest resistance and may store the most significant bits of data, and each string $310_N$ may be coupled to the highest resistance and may store the least significant bits of data.

For some embodiments, each resistor 340 may be a transistor configured to act as a resistor. For example, the resistance of a transistor may be related to the channel length of the transistor, where the greater the channel length the greater the resistance. Therefore, the resistances on each string may be preset, e.g., during fabrication of the memory array, by fabricating the transistor, acting as a resistor, to have a predetermined channel length.

For example, strings $310_1$ to $310_N$ may be respectively coupled to increasing resistances by fabricating the transistors, acting as resistors, respectively coupled in series with strings $310_1$ to $310_N$ to respectively have increasing channel lengths. For embodiments, where resistors with different resistances are coupled to a particular string, the different resistances may be respectively preset by respectively coupling transistors with different channel lengths to the particular string.

For other embodiments, each resistor 340 may be a programmable resistor. For example, each resistor 340 may be configured in a manner similar to a memory cell 315. In one example, each resistor 340 may be a charge-storage cell having a charge storage structure 342 and a control gate 344 coupled to (and in some cases forming) a control line 345. For example, the control gates of resistors $340_{1,1}$, $340_{2,1}$, $340_{1,2}$, $340_{2,2}$, $340_{1,N}$, and $340_{2,N}$ may be respectively coupled to control lines $345_{1,1}$, $345_{2,1}$, $345_{1,2}$, $345_{2,2}$, $345_{1,N}$, and $345_{2,N}$.

The resistance of a charge-storage cell is related to a difference between the threshold voltage programmed into the charge-storage cell and a voltage VC applied to the control gate 344 (e.g., the voltage placed on a corresponding control line 345). For example, a small difference, e.g., corresponding to charge-storage cell being partially ON, may produce a large resistance, and progressively increasing the difference, may progressively decrease the resistance until the difference is large enough that the charge-storage cell is fully ON, e.g., is placed in a read mode. For other embodiments, the each resistor 340 may be programed to the same threshold voltage, and the voltages VC applied to the control gates may be adjusted to adjust the resistance. Control lines 345 may be coupled to drivers, such as drivers 232, that apply the voltages VC.

For some embodiments, the voltage VC that is to be applied to the control gate of a resistor 340 to effect a certain reduction in the current level may be determined from an iterative process. For example, the resistor is programmed to a certain threshold voltage and the voltage VC is adjusted until the desired current level is obtained. The voltage VC thus obtained may be subsequently used in conjunction with the threshold voltage to cause the resistor 340 to set the current flow through a corresponding string 310.

In one example, the voltages $VC_{1,1}$ and $VC_{2,1}$ respectively applied to control lines $345_{1,1}$ and $345_{2,1}$ and the threshold voltages of the resistors $340_{1,1}$ and $340_{2,1}$ respectively coupled to control lines $345_{1,1}$ and $345_{2,1}$ may cause the voltages $VC_{1,1}$ and $VC_{2,1}$ to act as pass voltages so that resistors $340_{1,1}$ and $340_{2,1}$ provide little resistance to any current flowing through the respective string $310_1$. As such, the resistors $340_{1,1}$ and $340_{2,1}$ may be set to reduce the current level by substantially a factor of one, e.g., substantially no reduction, and thus the strings $310_1$ coupled in series with resistors $340_{1,1}$ and $340_{2,1}$ may be said to have a weight factor of substantially one. For some embodiments, the strings $310_1$ in columns 212 may store the most significant bits of data (e.g., data feature vectors) stored in those columns.

Continuing with the example, the voltages $VC_{1,2}$ and $VC_{2,2}$ respectively applied to control lines $345_{1,2}$ and $345_{2,2}$ and the threshold voltages of the resistors $340_{1,2}$ and $340_{2,2}$ respectively coupled to control lines $345_{1,2}$ and $345_{2,2}$ may cause the overall (e.g., combined) resistance of the resistors $340_{1,2}$ and $340_{2,2}$ to be, for example, substantially two times the combined resistance of resistors $340_{1,1}$ and $340_{2,1}$. As such, resistors $340_{1,2}$ and $340_{2,2}$ may act to reduce the current level by substantially a factor of 2, and thus the strings $310_2$ coupled in series with resistors $340_{1,2}$ and $340_{2,2}$ may be said to have a weight factor of substantially ½. That is, the current flow through resistors $340_{1,2}$ and $340_{2,2}$ may be substantially a factor of two less than through resistors $340_{1,1}$ and $340_{2,1}$. For some embodiments, the strings $310_2$ in columns 212 may store the next-most (e.g., the second-most) significant bits of data (e.g., data feature vectors) stored in those columns.

Continuing further with the example, the voltages $VC_{1,N}$ and $VC_{2,N}$ respectively applied to control lines $345_{1,N}$ and $345_{2,N}$ and the threshold voltages of the resistors $340_{1,N}$ and $340_{2,N}$ respectively coupled to control lines $345_{1,N}$ and $345_{2,N}$ may cause the combined resistance of the resistors $340_{1,N}$ and $340_{2,N}$ coupled thereto to be, for example, substantially $2^{N-1}$ times the combined resistance of resistors $340_{1,1}$ and $340_{2,1}$. As such, resistors $340_{1,N}$ and $340_{2,N}$ may act to reduce the current level by substantially a factor of $2^{N-1}$, and thus the strings $310_N$ coupled in series with resistors $340_{1,N}$ and $340_{2,N}$ may be said to have a weight factor of substantially $\frac{1}{2}^{N-1}$. That is, the current flow through resistors $340_{1,N}$ and $340_{2,N}$ may be substantially a factor of $2^{N-1}$ less than through resistors $340_{1,1}$ and $340_{2,1}$. For some embodiments, the strings $310_N$ in columns 212 may store the least significant bits of data (e.g., data feature vectors) stored in those columns.

For some embodiments, bits of data of a data feature vector to be compared to like bits of data of an input feature vector may be stored in pairs of memory cells 315 so that each string 310 may store M/2 bits of data. For example, a memory-cell pair $315_1$, $315_2$ of string $310_1$ may store the most significant bit of a component of a data feature vector to be compared to the most significant bit of the same component of the input feature vector; a memory-cell pair $315_1$, $315_2$ of string $310_N$ may store the least significant bit of the component of the data feature vector to be compared to the least significant bit of the component of the input feature vector; and the memory-cell pair $315_1$, $315_2$, of string $310_2$ may store a bit (e.g., the second-most significant bit) of the component of the data feature vector between the most significant bit and the least significant bit of the component of the data feature vector to be compared to a like bit (e.g., the second-most significant bit) of the component of the input feature vector between the most significant bit and the least significant bit of the component of the input feature vector.

Another memory-cell pair of string $310_1$ may store the most significant bit of another component of the data feature vector stored in the respective column 212 to be compared to the most significant bit of another component of the input feature vector; another memory-cell pair of string $310_2$ may store the second-most significant bit of the other component of the data feature vector stored in the respective column 212 to be compared to the second-most significant bit of the other component of the input feature vector; and another memory-cell pair of string $310_N$ may store the least significant bit of the other component of the data feature vector stored in the respective column 212 to be compared to the least significant bit of the other component of the input feature vector. Each bit of a input feature vector may correspond to the values (e.g., bit values d and d*) stored in two registers 245 (FIG. 2).

Figure 4:
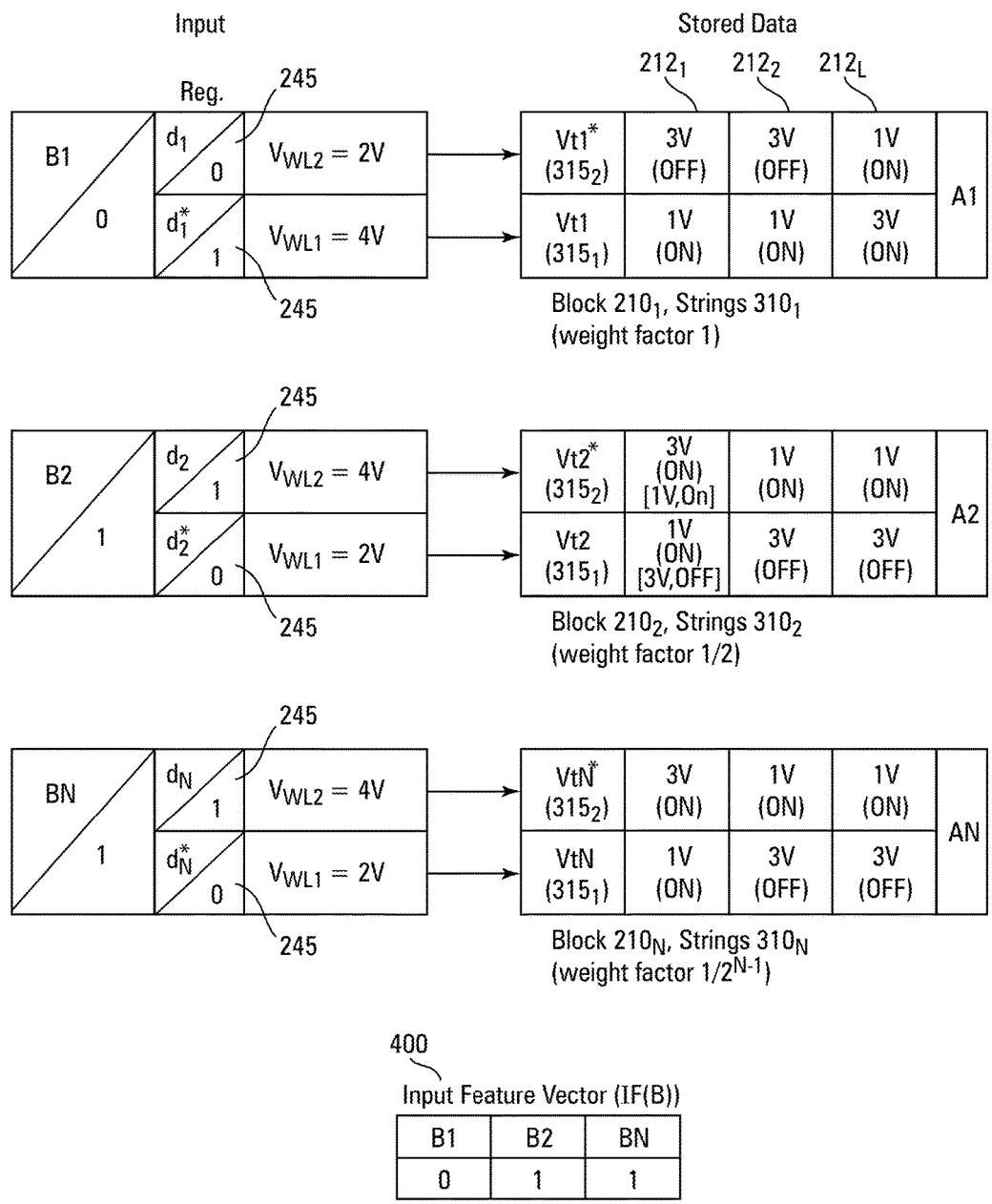
FIG. 4 is an example of comparing a input data to data stored in a memory array, according to another embodiment.

In the example of FIG. 4, an input feature vector 400 (e.g., IF(B)=(B1, B2, BN) is programmed into registers of memory device 100, such as input registers 245 of input buffer 120. Input feature vector 400 may have components B1, B2, and BN. For example, the input feature vector 400 may represent a pattern, and each component B may be a feature (e.g., attribute) of the pattern. For example, each component B may be a feature of an unknown person. To simplify the example of FIG. 4, each component B may correspond to a single binary bit that may have a value of binary 1 or binary 0. For example, the value of components B1, B2, and BN may be respectively, binary 0, (corresponding bit values $d_1$*=1 and $d_1$=0), binary 1 (corresponding bit values $d_2$*=0 and $d_2$=1), and binary 1 (corresponding bit values $d_N$*=0 and $d_N$=1), as shown in FIG. 4. However, for other embodiments, each feature B may have a value expressed by a plurality of binary bits.

Component B1 may be the most important feature in a comparison of input feature vector 400 to data feature vectors stored in memory array 204, component B2 the next-most (e.g., the second-most) important feature of input feature vector 400, and component BN the least important feature of input feature vector 400. Therefore, the bit of component B1 may be the most significant bit of a binary expression of input feature vector 400; the bit of component B2 may be the second-most significant bit of the binary expression of input feature vector 400; and the bit of component BN may be the least significant bit of the binary expression of input feature vector 400. As such, input feature vector 400 may be represented by the binary expression 011, e.g., IF(B)=011.

Note that each component (e.g., bit in this example) of input feature vector 400 may use two register bits d and d*. For example, a register bit 0 may cause a voltage $V_{WL}$=2V to be applied to the word line 220 corresponding to the register containing bit 0, and a register bit 1 may cause a voltage $V_{WL}$=4V to be applied to the word line 220 corresponding to the register containing bit 1.

For some embodiments, a 0 value (bit) of input feature vector 400 may be coded as a first voltage (e.g., 2V) in a first register bit and a second voltage (e.g., 4V) in a second register bit in a pair of registers 245, and a 1 value (bit) of input feature vector 400 may be coded as the second voltage (e.g., 4V) in a first register bit and the first voltage (e.g., 2V) in the second register bit in a pair of registers 245, as shown in FIG. 4.

In the example of FIG. 4, input feature vector 400 is to be compared to a data feature vector stored in each of columns $212_1$, $212_2$, and $212_L$ of array 204 of FIG. 3. For example, each data feature vector may be a pattern that is to be compared to the pattern of input feature vector 400. For example, each data feature vector may represent a known person having different attributes respectively stored in blocks $210_1$ to $210_N$.

For example, a data feature vector $DF_1(A)$=(A1, A2, AN)$_1$ may be stored in column $212_1$; a data feature vector $DF_2(A)$=(A1, A2, AN)$_2$ may be stored in column $212_2$; and a data feature vector $DF_L(A)$=(A1, A2, AN)$_L$ may be stored in column $212_L$. Data feature vector $DF_1(A)$ may be equal to the binary expression 000; data feature vector $DF_2(A)$ may be equal to the binary expression 011; and data feature vector $DF_N(A)$ may be equal to the binary expression 111. Therefore, there is an exact match between input feature vector 400 (e.g., input feature vector IF(B)=011) and data feature vector $DF_2(A)$, a mismatch between the most significant bits of input feature vector IF(B) and data feature vector $DF_N(A)$, and a mismatch between the second-most significant bits of input feature vector IF(B) and data feature vector $DF_1(A)$ and the least significant bits of input feature vector IF(B) and data feature vector $DF_1(A)$. As discussed below, the most, second-most, and least significant bits may respectively have the weight factors of 1, ½, and $\frac{1}{2}^{N-1}$.

For some embodiments, a plurality of bits may be stored in a string of memory cells. For example, each of a plurality of memory-cell pairs in a string may store a bit. The bits stored in a string of memory cells may be bits of different components of a data feature vector. Alternatively, the bits stored in a string of memory cells may be different bits of a single component of a data feature vector.

The data stored in columns $212_1$, $212_2$, and $212_L$ in block $210_1$ may represent a component (e.g., a feature) A1 of the data feature vectors stored in columns $212_1$, $212_2$, and $212_L$ and may be in the same category (e.g., of the same type) as component B1 of input feature vector 400; the data stored in columns $212_1$, $212_2$, and $212_L$ in block $210_2$ may represent a component (e.g., a feature) A2 of the data feature vectors stored in columns $212_1$, $212_2$, and $212_L$ and may be in the same category (e.g., of the same type) as component B2 of input feature vector 400; and the data stored in columns $212_1$, $212_2$, and $212_L$ in block $210_N$ may represent a component (e.g., a feature) AN of the data feature vectors stored in columns $212_1$, $212_2$, and $212_L$ and may be in the same category (e.g., of the same type) as component BN of input feature vector 400. For example input feature vector 400 and the data feature vectors stored in columns $212_1$, $212_2$, and $212_L$ may represent people, and like components A1 and B1 may be race, like components A2 and B2 may be height, and like components AN and BN may be eye color, i.e., race, height, and eye color may be different categories.

Therefore, component B1 of input feature vector 400 (e.g., input feature vector IF(B)) will be compared to component A1 of data feature vectors $DF_1(A)$, $DF_2(A)$, and $DF_L(A)$. Component B2 of the input feature vector IF(B) will be compared to component A2 of data feature vectors $DF_1(A)$, $DF_2(A)$, and $DF_L(A)$. Component BN of the input feature vector IF(B) will be compared to component AN of data feature vectors $DF_1(A)$, $DF_2(A)$, and $DF_L(A)$.

Component A1 of the data feature vector stored in each of columns $212_1$, $212_2$, and $212_L$ may be stored in the memory-cell pair $315_1$, $315_2$ of string $310_1$ in each of columns $212_1$, $212_2$, and $212_L$; component A2 of the data feature vector stored in each of columns $212_1$, $212_2$, and $212_L$ may be stored in the memory-cell pair $315_1$, $315_2$ of string $310_2$ in each of columns $212_1$, $212_2$, and $212_L$; and component AN of the data feature vector stored in each of columns $212_1$, $212_2$, and $212_L$ may be stored in memory-cell pair $315_1$, $315_2$ of string $310_N$ in each of columns $212_1$, $212_2$, and $212_L$. Note that strings $310_1$, $310_2$, and $310_N$ are respectively in blocks $210_1$, $210_2$, and $210_N$ (FIG. 3).

For some embodiments, the components A1, A2, and A3 of the data feature vector stored in each of columns $212_1$, $212_2$, and $212_L$ may respectively be the most, second-most, and least important features in the comparison to input data feature vector 400, and thus may respectively be the most, second-most, and least significant bits of the data feature vector stored in each of columns $212_1$, $212_2$, and $212_L$. Component B1 of input data feature vector 400 is to be compared to data stored in the memory-cell pair $315_1$, $315_2$ of string $310_1$ in each of columns $212_1$, $212_2$, and $212_L$. Component B2 of input data feature vector 400 is to be compared to the data stored in the memory-cell pair $315_1$, $315_2$ of string $310_2$ in each of columns $212_1$, $212_2$, and $212_L$. Component AN of input data feature vector 400 is to be compared to the data stored in the memory-cell pair $315_1$, $315_2$ of string $310_N$ in each of columns $212_1$, $212_2$, and $212_L$. That is, the most significant bit of the input data (e.g., corresponding to input feature vector 400) is compared to the most significant bit of the data stored in each of columns $212_1$, $212_2$, and $212_L$; the second-most significant bit of the input data is compared to the second-most significant bit of the data stored in each of columns $212_1$, $212_2$, and $212_L$; and the least significant bit of the input data is compared to the least significant bit of the data stored in each of columns $212_1$, $212_2$, and $212_L$.

Each memory cell $315_1$ is programed to a threshold voltage Vt, and each memory cell $315_2$ is programed to a threshold voltage Vt*. The values of threshold voltages Vt* and Vt are shown in FIG. 4 and represent stored data. For example, memory cells $315_1$ and $315_2$ in block $210_1$ are respectively programed to threshold voltages Vt1 and Vt1*; memory cells $315_1$ and $315_2$ in block $210_2$ are respectively programed to threshold voltages Vt2 and Vt2*; and memory cells $315_1$ and $315_2$ in block $210_N$ are respectively programed to threshold voltages VtN and VtN*.

To compare component B1 of input feature vector 400 to the data stored in the memory-cell pair $315_1$, $315_2$ of string $310_1$ in each of columns $212_1$, $212_2$, and $212_L$, the register bits $d_1^*$ and $d_1$ corresponding to component B1 of input feature vector 400 may cause a voltage $V_{WL1}=4V$ (e.g., corresponding to a bit value of $d_1^*=1$) to be applied to the word line $220_1$ (FIG. 3) in block $210_1$ and a voltage $V_{WL2}=2V$ (e.g., corresponding to a bit value of $d_1=0$) to be applied to the word line $220_2$ (FIG. 3) in block $210_1$. A pass voltage may be applied to the remaining word lines (e.g., the word lines other than word lines $220_1$ and $220_2$) in block $210_1$. That is, the remaining word lines may receive a voltage that allows the memory cells coupled thereto in the string $310_1$ in each of columns $212_1$, $212_2$, and $212_L$ to pass current with little resistance.

FIG. 4 shows the status of the memory cell $315_1$ in block $210_1$ in each of columns $212_1$, $212_2$, and $212_L$ in response applying the voltage $V_{WL1}=4V$ to the word line $220_1$ in block $210_1$. The status of the memory cell $315_2$ in block $210_1$ in each of columns $212_1$, $212_2$, and $212_L$ in response to applying the voltage $V_{WL2}=2V$ to the word line $220_2$ in block $210_1$ is also shown.

The memory cells $315_2$ in the strings $310_1$ of columns $212_1$ and $212_2$ are OFF, in that the voltage $V_{WL2}=2V$ applied to the word line $220_2$ in block $212_1$ is less than the threshold voltage (e.g., Vt1*=3V) of these memory cells $315_2$, and is thus insufficient to turn these memory cells $315_2$ ON. However, the memory cell $315_2$ in the string $310_1$ in column $212_L$ is turned ON, in that the voltage $V_{WL2}=2V$ applied to the word line $220_2$ is greater than the threshold voltage (e.g., Vt1*=1V) on that memory cell $315_2$, and is sufficient to turn that memory cell $315_2$ ON. The memory cells $315_1$ in the strings $310_1$ of columns $212_1$, $212_2$, and $212_L$ are all ON, in that the voltage $V_{WL1}=4V$ applied to the word line $220_1$ in block $212_1$ is greater than the threshold voltage on those memory cells $315_1$ (e.g., Vt1=1V for the memory cells $315_1$ in columns $212_1$ and $212_2$ and Vt1=3V for the memory cell $315_1$ in column $212_L$), and is sufficient to turn those memory cells $315_1$ ON.

For some embodiments, a memory cell $315_2$ having a threshold voltage of Vt1*=3V stores a bit value of 1, and a memory cell $315_1$ having a threshold voltage of Vt1=1V stores a bit value of 0. Therefore, the memory-cell pair $315_1$, $315_2$ stores a value of binary 0 when memory cell $315_1$ stores a bit value of 0 and memory cell $315_2$ stores a bit value of 1. A memory cell $315_2$ having a threshold voltage of Vt1*=1V stores a bit value of 0, and a memory cell $315_1$ having a threshold voltage of Vt1=3V stores a bit value of 1. Therefore, the memory-cell pair $315_1$, $315_2$ stores a value of binary 1 when memory cell $315_2$ stores a bit value of 0 and memory cell $315_1$ stores a bit value of 1. As such, component A1 of the data feature vector stored in column $212_1$ has a binary value of 0, which matches component B1 of the input feature vector. Component A1 of the data feature vector stored in column $212_2$ has a binary value of 0, which matches component B1 of the input feature vector. Component A1 of the data feature vector stored in column $212_L$ has a binary value of 1, which does not match (e.g., mismatches) component B1 of the input feature vector.

Therefore, the ON, OFF status of the memory-cell pairs $315_1$, $315_2$ in the strings $310_1$ of columns $212_1$ and $212_2$ represents a match between component B1 of input feature vector 400 and the data stored in the memory-cell pairs $315_1$, $315_2$ in the strings $310_1$ of columns $212_1$ and $212_2$, i.e., the match between component B1 of input feature vector 400 and the component A1 of the data feature vectors stored in columns $212_1$ and $212_2$. The ON, ON status of the memory-cell pair $315_1$, $315_2$ in the string $310_1$ of column $212_L$ represents a mismatch between component B1 of input feature vector 400 and the data stored in the memory-cell pair $315_1$, $315_2$ in the string $310_1$ of column $212_L$, i.e., the mismatch between component B1 of input feature vector 400 and the component A1 of the data feature vector stored in column $212_L$.

For some embodiments, the bit lines $215_1$, $215_2$, and $215_L$ (FIG. 3) respectively corresponding to columns $212_1$, $212_2$, and $212_L$ may be charged. The OFF status of the memory cells $315_2$ in the strings $310_1$ of columns $212_1$ and $212_2$ acts to prevent the bit lines $215_1$ and $215_2$ from discharging through the strings $310_1$ in columns $212_1$ and $212_2$. That is, current discharge through a string may be prevented in the event of a match. However, the ON status of both memory cell $315_1$ and memory cell $315_2$ in the string $310_1$ of column $212_L$ allows the bit line $215_N$ to discharge through the string $310_1$ in column $212_L$. That is, current discharge through a string may be allowed in the event of a mismatch.

Since component A1 of the data feature vector stored in each of columns $212_1$, $212_2$, and $212_L$ is the most significant bit of the data stored in each of columns $212_1$, $212_2$, and $212_L$ and is stored in the memory-cell pair $315_1$, $315_2$ of string $310_1$ in each of columns $212_1$, $212_2$, and $212_L$, the string $310_1$ in each of columns $212_1$, $212_2$, and $212_L$, and thus block $210_1$ containing string $310_1$, may be weighted with the largest weight factor of the strings $310_1$, $310_2$, $310_N$ and thus of the blocks $210_1$, $210_2$, $210_N$, e.g., a weight factor of 1. The weight factor of 1 may signify that component A1 of the data feature vector stored in each of columns $212_1$, $212_2$, and $212_L$ is the most significant bit of the data stored in each of columns $212_1$, $212_2$, and $212_L$.

To set the weight factor of 1, the one or more resistors 340 coupled in series with the string $310_1$ in each of columns $212_1$, $212_2$, and $212_1$, may be adjusted so that there is substantially no added resistance due to one or more resistors 340. Therefore, the level of the current on charged bit line $215_L$ that discharges through the string $310_1$ in column $212_L$, is reduced by a factor of substantially one, e.g., substantially no reduction.

For embodiments where the one or more resistors 340 are configured as charge-storage cells, the voltage applied to the control gates thereof may cause the one or more resistors 340 to operate as pass transistors to produce the weight factor of 1. For example, the series-coupled resistors $340_{1,1}$ and $340_{1,2}$ (FIG. 3) coupled in series with the string $310_1$ in each of columns $212_1$, $212_2$, and $212_L$, may be programmed to a particular threshold voltage, and the voltages $VC_{1,1}$ and $VC_{2,1}$ respectively applied to control lines $345_{1,1}$ and $345_{1,2}$ (FIG. 3) respectively coupled to resistors $340_{1,1}$ and $340_{2,1}$ may be set to a value sufficiently above the particular threshold voltage so that the resistors $340_{1,1}$ and $340_{2,1}$ are fully ON and act as pass transistors with substantially no resistance added to the strings $310_1$ in columns $212_1$, $212_2$, and $212_L$. For some embodiments, the voltages $VC_{1,1}$ and $VC_{2,1}$ may be respectively applied to control lines $345_{1,1}$ and $345_{2,1}$ substantially concurrently (e.g., concurrently) with applying the voltage $V_{WL2}$=2V to the word line $220_2$ in block $212_1$ and applying the voltage $V_{WL1}$=4V to the word line $220_1$ in block $212_1$.

Continuing with the example of FIG. 4, to compare component B2 of input feature vector 400 to the data stored in the memory-cell pair $315_1$, $315_2$ of string $310_2$ in each of columns $212_1$, $212_2$, and $212_L$, the register bits $d_2$ and $d_2^*$ corresponding to component B2 of input feature vector 400 may cause a voltage $V_{WL2}$=4V (e.g., corresponding to a bit value of $d_2$=1) to be applied to the word line $220_2$ in block $210_2$ and a voltage $V_{WL1}$=2V (e.g., corresponding to a bit value of $d_2^*$=0) to be applied to the word line $220_1$ in block $210_2$. A pass voltage may be applied to the remaining word lines (e.g., the word lines other than word lines $220_1$ and $220_2$) in block $210_2$. That is, the remaining word lines may receive a voltage that allows the memory cells coupled thereto in the string $310_2$ in each of columns $212_1$, $212_2$, and $212_L$ to pass current with little resistance.

FIG. 4 shows the status of the memory cell $315_1$ in block $210_2$ in each of columns $212_1$, $212_2$, and $212_L$ in response to applying the voltage $V_{WL1}$=2V to the word line $220_1$ in block $210_2$. The status of the memory cell $315_2$ in block $210_2$ in each of columns $212_1$, $212_2$, and $212_L$ in response to applying the voltage $V_{WL2}$=4V to the word line $220_2$ in block $210_2$ is also shown.

The memory cells $315_2$ in the strings $310_2$ of columns $212_1$, $212_2$, and $212_L$ are all ON, in that the voltage $V_{WL2}$=4V applied to the word line $220_2$ in block $212_2$ is greater than the threshold voltage on those memory cells $315_2$ (e.g., Vt2*=1V for the memory cells $315_2$ in columns $212_2$ and $212_L$ and Vt2*=3V for the memory cell $315_2$ in column $212_1$), and is sufficient to turn those memory cells $315_2$ ON. The memory cells $315_1$ in the strings $310_2$ of columns $212_2$ and $212_L$ are OFF, in that the voltage $V_{WL1}$=2V applied to the word line $220_1$ in block $212_2$ is less than the threshold voltage of these memory cells $315_2$ (e.g., Vt2=3V), and is thus insufficient to turn these memory cells $315_1$ ON. However, the memory cell $315_1$ in the string $310_2$ in column $212_1$ is turned ON, in that the voltage $V_{WL1}$=2V applied to the word line $220_1$ in block $212_2$ is greater than the threshold voltage on that memory cell $315_1$ (e.g., Vt2=1V), and is sufficient to turn that memory cell $315_1$ ON.

For some embodiments, a memory cell $315_2$ having a threshold voltage of Vt2*=3V stores a bit value of 1, and a memory cell $315_1$ having a threshold voltage of Vt2=1V stores a bit value of 0. Therefore, the memory-cell pair $315_1$, $315_2$ stores a value of binary 0 when memory cell $315_2$ stores a bit value of 1 and memory cell $315_1$ stores a bit value of 0. A memory cell $315_2$ having a threshold voltage of Vt2*=1V stores a bit value of 0, and a memory cell $315_1$ having a threshold voltage of Vt2=3V stores a bit value of 1. Therefore, the memory-cell pair $315_1$, $315_2$ stores a value of binary 1 when memory cell $315_2$ stores a bit value of 0 and memory cell $315_1$ stores a bit value of 1. As such, components A2 of the data feature vectors stored in columns $212_2$ and $212_L$ have binary values of 1, which match component B2 of the input feature vector 400. Component A2 of the data feature vector stored in column $212_1$ has a binary value of 0, which does not match (e.g., mismatches) component B2 of the input feature vector 400.

Therefore, the OFF, ON status of the memory-cell pairs $315_1$, $315_2$ in the strings $310_2$ of columns $212_2$ and $212_L$ represents a match between component B2 of the input feature vector 400 and the data stored in the memory-cell pairs $315_1$, $315_2$ in the strings $310_2$ of columns $212_2$ and $212_L$, i.e., the match between component B2 of input feature vector 400 and the component A2 of the data feature vectors stored in columns $212_2$ and $212_L$. The ON, ON status of the memory-cell pair $315_1$, $315_2$ in the string $310_2$ of column $212_1$ represents a mismatch between component B2 of the input feature vector 400 and the data stored in the memory-cell pair $315_1$, $315_2$ in the string $310_2$ of column $212_1$, i.e., the mismatch between component B2 of the input feature vector 400 and the component A2 of the data feature vector stored in column $212_1$.

The OFF status of the memory cells $315_1$ in the strings $310_2$ of columns $212_2$ and $212_L$ acts to prevent the charged bit lines $215_2$ and $215_L$ from discharging through the strings $310_2$ in columns $212_2$ and $212_L$, signaling the match. However, the ON status of both memory cell $315_1$ and memory cell $315_2$ in the string $310_2$ of column $212_1$ allows the charged bit line $215_1$ to discharge through the string $310_2$ in column $212_L$, signaling the mismatch.

Since component A2 of the data feature vector stored in each of columns $212_1$, $212_2$, and $212_L$ is the second-most significant bit of the data stored in each of columns $212_1$, $212_2$, and $212_L$ and is stored in the memory-cell pair $315_1$, $315_2$ of string $310_2$ in each of columns $212_1$, $212_2$, and $212_L$, the string $310_2$ in each of columns $212_1$, $212_2$, and $212_L$, and thus block $210_2$, may be weighted with second largest weight factor of the strings $310_1$, $310_2$, $310_N$, and thus of the blocks $210_1$, $210_2$, $210_N$, e.g., a weight factor of ½. The weight factor of ½ may signify that component A2 of the data feature vector stored in each of columns $212_1$, $212_2$, and $212_L$ is the second-most significant bit of the data stored in each of columns $212_1$, $212_2$, and $212$.

To set the weight factor of ½, the one or more resistors 340 coupled in series with the string $310_2$ in each of columns $212_1$, $212_2$, and $212_L$ may be adjusted so that the level of any current discharging through strings $310_2$ in columns $212_1$, $212_2$, and $212_L$ is reduced by substantially a factor of 2. Therefore, the level of the current on the charged bit line $215_1$ that discharges through the string $310_2$ in column $212_1$ is reduced by a factor of substantially 2.

For embodiments where the one or more resistors 340 are configured as charge-storage cells, the voltage applied to the control gates thereof in conjunction with the threshold voltage programmed in the one or more resistors 340 may cause the one or more resistors 340 to turn partially on so as to reduce the current flow by substantially the factor of 2 and thus produce the weight factor of ½. For example, the difference between the voltage applied to the control gate of a resistor coupled in series with the string $310_2$ in each of columns $212_1$, $212_2$, and $212_L$ and the threshold voltage of that resistor may be different (e.g., less) than the difference between the voltage applied to the control gate of a resistor coupled in series with the string $310_1$ in each of columns $212_1$, $212_2$, and $212_L$ and the threshold voltage of that resistor.

In embodiments where the series-coupled resistors $340_{1,2}$ and $340_{2,2}$ (FIG. 3) coupled in series with the string $310_2$ in each of columns $212_1$, $212_2$, and $212_L$ may be programmed to a particular threshold voltage, the voltages $VC_{1,2}$ and $VC_{2,2}$ respectively applied to control lines $345_{1,2}$ and $345_{2,2}$ (FIG. 3) respectively coupled to resistors $340_{1,2}$ and $340_{2,2}$ may be set to a value that causes the resistors $340_{1,2}$ and $340_{2,2}$ to be partially ON, thereby reducing the current flow by substantially the factor of 2. Note that since current only discharges through string $310_2$ of column $212_1$, it is only this current that would be affected by the reduced resistance. For some embodiments, the voltages $VC_{1,2}$ and $VC_{2,2}$ may be respectively applied to control lines $345_{1,2}$ and $345_{2,2}$ substantially concurrently (e.g., concurrently) with applying the voltage $V_{WL1}=2V$ to the word line $220_1$ in block $210_2$ and applying the voltage $V_{WL2}=4V$ to the word line $220_2$ in block $210_2$ as well as with respectively applying the voltages $VC_{1,1}$ and $VC_{2,1}$ to control lines $345_{1,1}$ and $345_{2,1}$ in block $210_1$ and with applying the voltage $V_{WL1}=4V$ to the word line $220_1$ in block $210_1$ and applying the voltage $V_{WL2}=2V$ the word line $220_2$ in block $210_1$.

Continuing with the example of FIG. 4, to compare component BN of the input feature vector 400 to the data stored in the memory-cell pair $315_1$, $315_2$ of string $310_N$ in each of columns $212_1$, $212_2$, and $212_L$, the register bits dN* and dN corresponding to component BN may cause a voltage $V_{WL1}=2V$ (e.g., corresponding to a bit value of dN*=0) to be applied to the word line $220_1$ in block $210_N$ and a voltage $V_{WL2}=4V$ (e.g., corresponding to a bit value of $d_N=1$) to be applied to the word line $220_2$ in block $210_N$. A pass voltage may be applied to the remaining word lines (e.g., the word lines other than word lines $220_1$ and $220_2$) in block $210_N$. That is, the remaining word lines may receive a voltage that allows the memory cells coupled thereto in the string $310_N$ in each of columns $212_1$, $212_2$, and $212_L$ to pass current with little resistance.

Note that the blocks $210_3$ to $210_{N-1}$ between blocks $210_2$ and $210_N$ may be masked, e.g., by mask bits stored in mask registers 240 (FIG. 2). For example, a mask bit may cause the memory cells coupled to a mask register 240 by a word line to be masked when the mask register 240 stores the mask bit. Also, current from the bit lines coupled to the strings in these blocks may be prevented from discharging through these strings, e.g., keeping the drain select gates 322 coupled to these strings OFF.

FIG. 4 shows the status of the memory cell $315_1$ in block $210_N$ in each of columns $212_1$, $212_2$, and $212_L$ in response to applying the voltage $V_{WL1}=2V$ to the word line $220_1$. The status of the memory cell $315_2$ in block $210_N$ in each of columns $212_1$, $212_2$, and $212_L$ in block $210_N$ in response to applying the voltage $V_{WL2}=4V$ to the word line $220_2$ is also shown.

The memory cells $315_2$ in the strings $310_N$ of columns $212_1$, $212_2$, and $212_L$ are all ON, in that the voltage $V_{WL2}=4V$ applied to the word line $220_2$ in block $212_N$ is greater than the threshold voltage on those memory cells $315_2$ (e.g., VtN*=1V on the memory cells $315_2$ in columns $212_2$ and $212_L$ and VtN*=3V on the memory cell $315_2$ in column $212_1$), and is sufficient to turn those memory cells $315_2$ ON. The memory cells $315_1$ in the strings $310_N$ of columns $212_2$ and $212_L$ are OFF, in that the voltage $V_{WL1}=2V$ applied to the word line $220_1$ in block $212_N$ is less than the threshold voltage of these memory cells $315_1$ (e.g., VtN=3V), and is thus insufficient to turn these memory cells $315_2$ ON. However, the memory cell $315_1$ in the string $310_N$ in column $212_1$ is turned ON, in that the voltage $V_{WL1}=2V$ applied to the word line $220_1$ in block $212_N$ is greater than the threshold voltage on that memory cell $315_1$ (e.g., VtN=1V), and is sufficient to turn that memory cell $315_1$ ON.

For some embodiments, a memory cell $315_2$ having a threshold voltage of VtN*=3V stores a bit value of 1, and a memory cell $315_1$ having a threshold voltage of VtN=1V stores a bit value of 0. Therefore, the memory-cell pair $315_1$, $315_2$ stores a value of binary 0 when memory cell $315_1$ stores a bit value of 1 and memory cell $315_2$ stores a bit value of 0. A memory cell $315_2$ having a threshold voltage of VtN*=1V stores a bit value of 0, and a memory cell $315_1$ having a threshold voltage of VtN=3V stores a bit value of 1. Therefore, the memory-cell pair $315_1$, $315_2$ stores a value of binary 1 when memory cell $315_2$ stores a bit value of 0 and memory cell $315_1$ stores a bit value of 1. As such, components AN of the data feature vectors stored in columns $212_2$ and $212_L$ have binary values of 1, which match component BN of the input feature vector 400. Component AN of the data feature vector stored in column $212_1$ has a binary value of 0, which does not match (e.g., mismatches) component BN of the input feature vector 400.

The OFF, ON status of the memory-cell pairs $315_1$, $315_2$ in the strings $310_N$ of columns $212_2$ and $212_L$ represents a match between component AN of input feature vector 400 and the data stored in the memory-cell pairs $315_1$, $315_2$ in the strings $310_N$ of columns $212_2$ and $212_L$, i.e., the match between component BN of input feature vector 400 and the component AN of the data feature vectors stored in columns $212_2$ and $212_L$. The ON, ON status of the memory-cell pair $315_1$, $315_2$ in the string $310_N$ of column $212_1$ represents a mismatch between component BN of input feature vector 400 and the data stored in the memory-cell pair $315_1$, $315_2$ in the string $310_N$ of column $212_1$, i.e., a mismatch between component BN of input feature vector 400 and the component AN of the data feature vector stored in column $212_1$.

The OFF status of the memory cells $315_1$ in the strings $310_N$ of columns $212_2$ and $212_L$ acts to prevent the charged bit lines $215_2$ and $215_L$ from discharging through the strings $310_N$ in columns $212_2$ and $212_L$, signaling the match. However, the ON status of both memory cell $315_1$ and memory cell $315_2$ in the string $310_N$ of column $212_1$ allows the charged bit line $215_1$ to discharge through the string $310_N$ in column $2121_L$, signaling the mismatch.

Since component AN of the data feature vector stored in each of columns $212_1$, $212_2$, and $212_L$ is the least significant bit of the data stored in each of columns $212_1$, $212_2$, and $212_L$ and is stored in the memory-cell pair $315_1$, $315_2$ of string $310_N$ in each of columns $212_1$, $212_2$, and $212_L$, the string $310_N$ in each of columns $212_1$, $212_2$, and $212_L$, and thus block $210_N$, may be weighted with smallest weight factor of the strings $310_1$, $310_2$, $310_N$, and thus of the blocks $210_1$, $210_2$, $210_N$, e.g., a weight factor of $\frac{1}{2}^{N-1}$, where N is greater than 2. The weight factor of $\frac{1}{2}^{N-1}$ may signify that component AN of the data stored in each of columns $212_1$, $212_2$, and $212_L$ is the least significant bit of the data stored in each of columns $212_1$, $212_2$, and 212.

To set the weight factor of $\frac{1}{2}^{N-1}$, the one or more resistors 340 coupled in series with the string $310_N$ in each of columns $212_1$, $212_2$, and $212_L$ may be adjusted so that the level of any current discharging through strings $310_N$ in columns $212_1$, $212_2$, and $212_L$ is reduced by substantially a factor of $2^{N-1}$. Therefore, the level of the current on charged bit line $215_1$ that discharges through the string $310_N$ in column $212_1$ is reduced by a factor of substantially $2^{N-1}$.

For embodiments where the one or more resistors 340 are configured as charge-storage cells, the voltage applied to the control gates thereof in conjunction with the threshold voltage programmed in the one or more resistors 340 may cause the one or more resistors 340 to turn partially on so as to reduce the current flow by substantially the factor of $2^{N-1}$ and thus produce the weight factor of $\frac{1}{2}^{N-1}$. For example, the difference between the voltage applied to the control gate of a resistor coupled in series with the string $310_N$ in each of columns $212_1$, $212_2$, and $212_L$ and the threshold voltage of that resistor may be different (e.g., less) than the difference between the voltage applied to the control gate of a resistor coupled in series with the string $310_1$ in each of columns $212_1$, $212_2$, and $212_L$ and the threshold voltage of that resistor and different (e.g., less) than the difference between the voltage applied to the control gate of a resistor coupled in series with the string $310_2$ in each of columns $212_1$, $212_2$, and $212_L$ and the threshold voltage of that resistor.

In embodiments where the series-coupled resistors $340_{1,N}$ and $340_{2,N}$ (FIG. 3) coupled in series with the string $310_N$ in each of columns $212_1$, $212_2$, and $212_L$ may be programmed to a particular threshold voltage, the voltages $VC_{1,N}$ and $VC_{2,N}$ respectively applied to control lines $345_{1,N}$ and $345_{2,N}$ (FIG. 3) respectively coupled to resistors $340_{1,N}$ and $340_{2,N}$ may be set to a value that causes the resistors $340_{1,N}$ and $340_{2,N}$ to be partially ON, thereby reducing the current flow by substantially the factor of $2^{N-1}$. Note that since current only discharges through string $310_N$ of column $212_1$, it is only this current that would be affected by the reduced resistance.

For some embodiments, the voltages $VC_{L1,N}$ and $VC_{2,N}$ may be respectively applied to control lines $345_{1,N}$ and $345_{2,N}$ substantially concurrently (e.g., concurrently) with applying the voltage $V_{WL1}=2V$ the word line $220_1$ in block $212_N$ and applying the voltage $V_{WL2}=4V$ the word line $220_2$ in block $212_N$, as well as substantially concurrently (e.g., concurrently) with applying the respective the voltages $VC_{1,2}$ and $VC_{2,2}$ to control lines $345_{1,2}$ and $345_{2,2}$ in block $210_2$ and with respectively applying the respective the voltages $VC_{1,1}$ and $VC_{2,1}$ to control lines $345_{1,1}$ and $345_{2,1}$ in block $210_1$, and thus substantially concurrently (e.g., concurrently) with applying the voltage $V_{WL1}=2V$ to the word line $220_1$ in block $210_2$ and applying the voltage $V_{WL2}=4V$ to the word line $220_2$ in block $210_2$ and with applying the voltage $V_{WL1}=4V$ to the word line $220_1$ in block $210_1$ and applying the voltage $V_{WL2}=2V$ to the word line $220_2$ in block $210_1$. Therefore, the weight factors may applied concurrently to the blocks $210_1$, $210_2$, and $210_N$ and thus to strings $310_1$, $310_2$, and $310_N$.

The data stored in the memory-cell pairs $315_1$, $315_2$ in the strings $310_1$, $310_2$, and $310_N$ in column $212_2$ respectively matches components B1, B2, and BN of input feature vector 400, i.e., the components A1, A2, and AN of the data feature vector $DF_2(A)$ stored in column $212_2$ respectively match the components B1, B2, and BN of input feature vector 400. Therefore, there is an exact match between input feature vector 400 and the data feature vector $DF_2(A)$ stored in the memory-cell pairs $315_1$, $315_2$ in column $212_2$. This is reflected by the fact that a memory cell of the pairs $315_1$, $315_2$ in each of the strings $310_1$, $310_2$, and $310_N$ in column $212_2$ is OFF (i.e., memory cell $315_2$ in string $310_1$, memory cell $315_1$ in string $310_2$, and memory cell $315_1$ in string $310_N$ are OFF). This means that charged bit line $215_2$ coupled to the strings $310_1$, $310_2$, and $310_N$ in column $212_2$ is prevented from being discharged through the strings $310_1$, $310_2$, and $310_N$ in column $212_2$, meaning there is no current flow through bit line $215_2$, and the level of the current $I_{A2}$ (FIGS. 2 and 3) on bit line $215_2$ is zero.

Therefore, in the event of an exact match between an input feature vector and a data feature vector stored in the memory cells of a column, there is no current flow on the charged bit line coupled to those memory cells. That is, an exact match can be determined by detecting zero current flow through a charged bit line coupled memory cells whose data are compared with an input feature vector.

The components A2 and AN of the data feature vector $DF_L(A)$ stored in column $212_L$ respectively match the components B2 and BN of input feature vector 400. That is, the data stored in the memory-cell pairs $315_1$, $315_2$ in the strings $310_2$ and $310_N$ in column $212_L$ respectively match components B2 and BN of input feature vector 400, and current is prevented from flowing from charged bit line $215_L$ though the strings $310_2$ and $310_N$ in column $212_L$ by the turned-off memory cells $315_1$ in the strings $310_2$ and $310_N$ in column $212_L$.

However, component A1 of the data feature vector $DF_L(A)$ stored in column $212_L$ does not match component B1 of input feature vector 400. That is, the data stored in the memory-cell pair $315_1$, $315_2$ in the string $310_1$ in column $212_L$ does not match component B1 of input feature vector 400, and current $I_{AL}$ (FIGS. 2 and 3) flows from charged bit line $215_L$ through the string $310_1$ in column $212_L$. Therefore, in the event of a mismatch between an input feature vector and data a feature vector stored in the memory cells of a column, there is current flow on the charged bit line coupled to those memory cells. That is, a mismatch can be determined by detecting current flow through a charged bit line coupled to memory cells whose data are compared with an input feature vector.

Component A1 of the data feature vector $DF_1(A)$ stored in column $212_1$ matches component B1 of input feature vector 400. That is, the data stored in the memory-cell pairs $315_1$, $315_2$ in the string $310_1$ in column $212_1$ matches component B1 of input feature vector 400, and current is prevented from flowing from charged bit line $215_1$ though the string $310_1$ in column $212_1$ by the turned-off memory cell $315_2$ in the string $310_1$ in column $212_1$.

Component A2 of the data feature vector $DF_1(A)$ stored in column $212_1$ does not match component B2 of input feature vector 400. That is, the data stored in the memory-cell pair $315_1$, $315_2$ in the string $310_2$ in column $212_1$ does not match component B2 of input feature vector 400, and current flows from charged bit line $215_1$ through the string $310_2$ in column $212_1$. Component AN of the data feature vector $DF_1(A)$ stored in column $212_1$ does not match component BN of input feature vector 400. That is, the data stored in the memory-cell pair $315_1$, $315_2$ in the string $310_N$ in column $212_1$ does not match component BN of input feature vector 400, and current also flows from charged bit line $215_1$ through the string $310_N$ in column $212_1$. The total current $I_{A1}$ (FIGS. 2 and 3) on bit line $215_1$ is the sum of the current flowing through strings $310_2$ and $310_N$ in column $212_1$, in that strings $310_2$ and $310_N$ are coupled in parallel to bit line $215_1$.

The level of the current $I_{AL}$ on bit line $215_L$ is greater than the level of the current $I_{A1}$ on bit line $215_1$ when N is greater than 2. The current $I_{AL}$ on bit line $215_L$ is the current through string $310_1$ in column $212_L$, and the level of this current is substantially unreduced due to the weight factor of 1 for block $210_1$ and string $310_1$. Due to the weight factor of ½ for block $210_2$, and thus string $310_2$, the level of the current flowing through string $310_2$ is about ½ the current on bit line $215_1$. Due to the weight factor of $½^{N-1}$ for block $210_N$, and thus string $310_N$, the level of the current flowing through string $310_N$ is about $½^{N-1}$ the current on bit line $215_1$. Therefore, the level of the total current $I_{A1}$ on bit line $215_1$ (the sum of the current flowing through strings $310_2$ and $310_N$) is about $(½+½^{N-1})$ of the level of the current on bit line $215_L$.

The level of the current on a bit line is indicative of the degree (e.g., closeness) of a match between the data (e.g., data feature vectors) stored in memory cells coupled to the bit line and input data (e.g., a data feature vector), e.g., the lower the level the better (e.g., closer) the match. The level of the current $I_{A2}$ on bit line $215_2$ is zero, in that there is an exact match between the data stored in the memory-cell pairs coupled to bit line $215_2$ and input feature vector 400.

The mismatch between the data feature vector $DF_L(A)$ stored in memory-cell pairs coupled to bit line $215_L$ and input feature vector 400 occurred between the component B1 of input feature vector 400, i.e., the most important component of input feature vector 400 to the comparison, and the component A1 of the data feature vector $DF_L(A)$ stored in a memory-cell pair in block $210_1$ with a weight factor of 1, i.e., the component A1 of the data feature vector $DF_L(A)$ in column $212_L$ that is most important to the comparison.

The mismatch between the data feature vector $DF_1(A)$ stored in memory-cell pairs coupled to bit line $215_1$ and input feature vector 400 occurred between component B2 of input feature vector 400, i.e., the second most important component of input feature vector 400 to the comparison, and the component A2 of the data feature vector $DF_1(A)$ stored in a memory-cell pair in block $210_2$ with a weight factor of ½, i.e., the component A2 of the data feature vector $DF_1(A)$ in column $212_1$ that is second most important to the comparison.

The mismatch between the data feature vector $DF_1(A)$ stored in memory-cell pairs coupled to bit line $215_1$ and input feature vector 400 further occurred between the component BN of input feature vector 400, i.e., the least important component of input feature vector 400 to the comparison, and the component AN of the data feature vector $DF_1(A)$ stored in a memory-cell pair in block $210_N$ with a weight factor of $½^{N-1}$, i.e., the component AN of the data feature vector $DF_1(N)$ stored in column $212_1$ least important to the comparison.

Therefore, the data feature vector $DF_1(A)$ stored in the memory-cell pairs in column $212_1$ coupled to bit line $215_1$ is closer to matching (e.g., more likely to match) input feature vector 400 than the data feature vector $DF_L(A)$ stored in the memory-cell pairs in column $212_L$ coupled to bit line $215_L$. This is evident by the fact that the current level in bit line $215_1$ is lower than the current level in bit line $215_L$.

The current levels $I_{A1}$, $I_{A2}$, and $I_{AL}$, respectively in bit lines $215_1$, $215_2$, and $215_L$ may be respectively converted to the digital representations $I_{D1}$, $I_{D2}$, and $I_{DL}$ respectively at sense amps $225_1$, $225_2$, and $225_L$, as described above in conjunction with FIG. 2. The digital representations $I_{D1}$, $I_{D2}$, and $I_{DL}$ may then be compared to the particular reference $I_{ref}$ respectively at comparators $228_1$, $228_2$, and $228_L$, as further described above in conjunction with FIG. 2.

If it is deemed that a mismatch between input feature vector 400 and the data feature vectors stored in columns 212 occurs when component B1 of input feature vector 400 mismatches the component A1 of the data feature vectors stored in in strings $310_1$ of columns 212, the particular reference $I_{ref}$ may be selected to be less than a digital representation of the level of the unweighted current in strings $310_1$ of columns 212. For example, the particular reference $I_{ref}$ may be selected to be less than a digital representation of the level of the current through string $310_1$ in column $212_L$, e.g., less than the representation $I_{DL}$ of the level of the current $I_{AL}$ on bit line $215_L$, due to both of memory cells $315_1$ and $315_2$ in string $310_1$ of column $212_L$ being ON and block $210_1$ and string $310_1$ of column $212_L$ having a weight factor of one. That is, comparator $228_L$ will indicate that the representation $I_{DL}$ exceeds the particular reference $I_{ref}$, thereby indicating a mismatch, as indicated above in conjunction with FIG. 2.

Selecting the particular reference $I_{ref}$ to be less than representation $I_{DL}$ and greater than the representation $I_{D1}$, representing the level of the current of $I_{A1}$, will cause the data feature vector $DF_L(A)$ stored in column $212_L$ to be identified as mismatching input feature vector 400 and the data feature vectors $DF_1(A)$ and $DF_L(A)$ stored in columns $212_1$ and $212_2$ to be identified as potentially matching input feature vector 400. This differentiates the data feature vector stored in column $212_L$ from the data feature vectors stored in columns $212_1$ and $212_2$. The differentiation of the data feature vector stored in column $212_L$ from the data feature vector stored in column $212_1$ is enabled by the weighting of the strings in the respective columns.

Note that the data feature vectors stored in both of columns $212_1$ and $212_L$ mismatches the data stored in input feature vector 400. However, the mismatch between the data feature vector stored in column $212_L$ and input feature vector 400 is more critical to the comparison between the data feature vectors stored in columns 212 and input feature vector 400 than the mismatch between the data feature vector stored in column $212_1$ and input feature vector 400. The mismatch between the data feature vector stored in column $212_L$ and input feature vector 400 is due to a mismatch between component B1 of input feature vector 400 and the component A1 of the data feature vector stored in column $212_L$ that has a weight factor of 1. The mismatch between the data feature vector stored in column $212_1$ and input feature vector 400 is due to a mismatch between component B2 of input feature vector 400 and the component A2 of the data feature vector stored in column $212_1$ that has a weight factor of ½ and a mismatch between component BN of input feature vector 400 and the component AN of the data feature vector stored in column $212_1$ that has a weight factor of $½^{N-1}$.

Selecting the particular reference $I_{ref}$ to be less than representation $I_{D1}$ and greater than the representation $I_{D2}$, representing the level of the current of $I_{A2}$ (=0), will cause the data feature vectors stored in columns $212_1$ and $212_L$ to be identified as mismatching input feature vector 400 and the data feature vector stored in column $212_2$ to be identified as potentially matching input feature vector 400. Note that the data feature vector stored in column $212_2$ matches input feature vector 400 exactly, but an exact match can only be identified by selecting the particular reference $I_{ref}$ to be zero and the representation $I_{D2}$ being equal thereto.

Note that there may be some current in a string even though a memory cell in that string is turned off, owing to current leakage through the turned-off memory cell. As such, the current of $I_{A2}$ may be non-zero in spite of the memory cell in the string being turned off. Therefore, the exact match will not be indicated by comparing the representation $I_{D2}$, representing the level of the current of $I_{A2}$, to $I_{ref}$=zero. Therefore, register 230 may configured to store a certain value of $I_{ref}$ that compensates for the leakage, and memory device 100 may be configured to determine that the representation $I_{D2}$ is zero when $I_{D2}$ is less than or equal to the certain value.

To further illustrate that lower bit-line currents indicate closer matches, it is worthwhile to consider an example where the memory cell $315_2$ in string $310_2$ in column $212_1$ has a threshold voltage of 1V instead 3V, as shown in brackets in FIG. 4, and the memory cell $315_1$ in string $310_2$ in column $212_1$ has a threshold voltage of 3V instead 1V, as shown in brackets in FIG. 4. Note that this corresponds to a component A2' having a binary value of 1. Therefore, the data feature vector $DF_1'(A)=(A1, A2', AN)_1$ stored in column $212_1$ has a binary value of 010. Therefore, data feature vector $DF_1'(A)$ mismatches input feature vector 400 in the least significant bit, i.e., component BN of input feature vector 400 mismatches component AN of data feature vector $DF_1'(A)$.

In this example, memory cell $315_2$ remains ON in response to applying the voltage $V_{WL2}$=4V to the word line $220_2$ in block $210_2$, but memory cell $315_1$ is OFF in response to applying the voltage $V_{WL1}$=2V to the word line $220_1$ in block $210_2$.

The data feature vector $DF_1'(A)=(A1, A2', AN)_1$=010 matches input feature vector 400 (IF(B)=(B1, B2, BN)=011) more closely than data feature vector $DF_1(A)=(A1, A2, AN)_1$=000 that was previously stored in column $212_1$ and was discussed above. This is because the mismatch between data feature vector $DF_1'(A)$ and input feature vector IF(B) occurs only in the least significant bit, whereas the mismatch between data feature vector $DF_1(A)$ and input feature vector IF(B) occurs both in the second-most significant bit and the in the least significant bit.

In the case of data feature vector $DF_1'(A)$, the current from charged bit line $215_1$ is prevented from flowing through string $310_1$ of column $212_1$, in that memory cell $315_2$ in string $310_1$ is OFF. Current from charged bit line $215_1$ is also prevented from flowing through string $310_2$ of column $212_1$, in that memory cell $315_1$ in string $310_2$ is OFF. Therefore, the current from charged bit line $215_1$ only flows through string $310_N$, in that both memory cell $315_1$ and memory cell $315_2$ in string $310_N$ of column $212_1$ are ON.

However, in the case of data feature vector $DF_1'(A)$, the current from charged bit line $215_1$ that flows through string $310_N$ is reduced by a factor of $2^{N-1}$, owing to the weight factor of $½^{N-1}$ on block $210_N$ and string $310_N$. This current is now the only contribution to the current $I'_{A1}$ (FIGS. 2 and 3) on bit line $215_1$, so the level of the current $I'_{A1}$ on bit line $215_1$ is about $½^{N-1}$ of the level of the substantially unreduced current on bit line $215_L$, as compared to the previous case of the data feature vector $DF_1(A)$, where the level of total current $I_{A1}$ on bit line $215_1$ was about (½+$½^{N-1}$) of the level of the current on bit line on bit line $215_L$. The reduced current is indicative that the mismatch between data feature vector $DF_1'(A)$=010 and input feature vector IF(B)=011 occurs only in the least significant bit as opposed to the mismatch between data feature vector $DF_1(A)$=000 and input feature vector IF(B)=011 occurring in both the second-most significant bit and the least significant bit.

Current level $I'_{A1}$ may be subsequently converted to a representation $I'_{D1}$, representing the level of the current $I'_{A1}$, at sense amp $225_1$ and compared to the particular reference $I_{ref}$ at comparator $228_1$, as shown in FIG. 2. The particular reference $I_{ref}$ may be selected so that the respective comparators identify exact matches between input feature vector 400 and the data feature vectors stored in columns 212 and/or mismatches only in the least significant bits of input feature vector 400 and the data feature vectors stored in columns 212. Note that the smaller the current on a bit line the closer the match, where zero current corresponds to an exact match.

Figure 5:
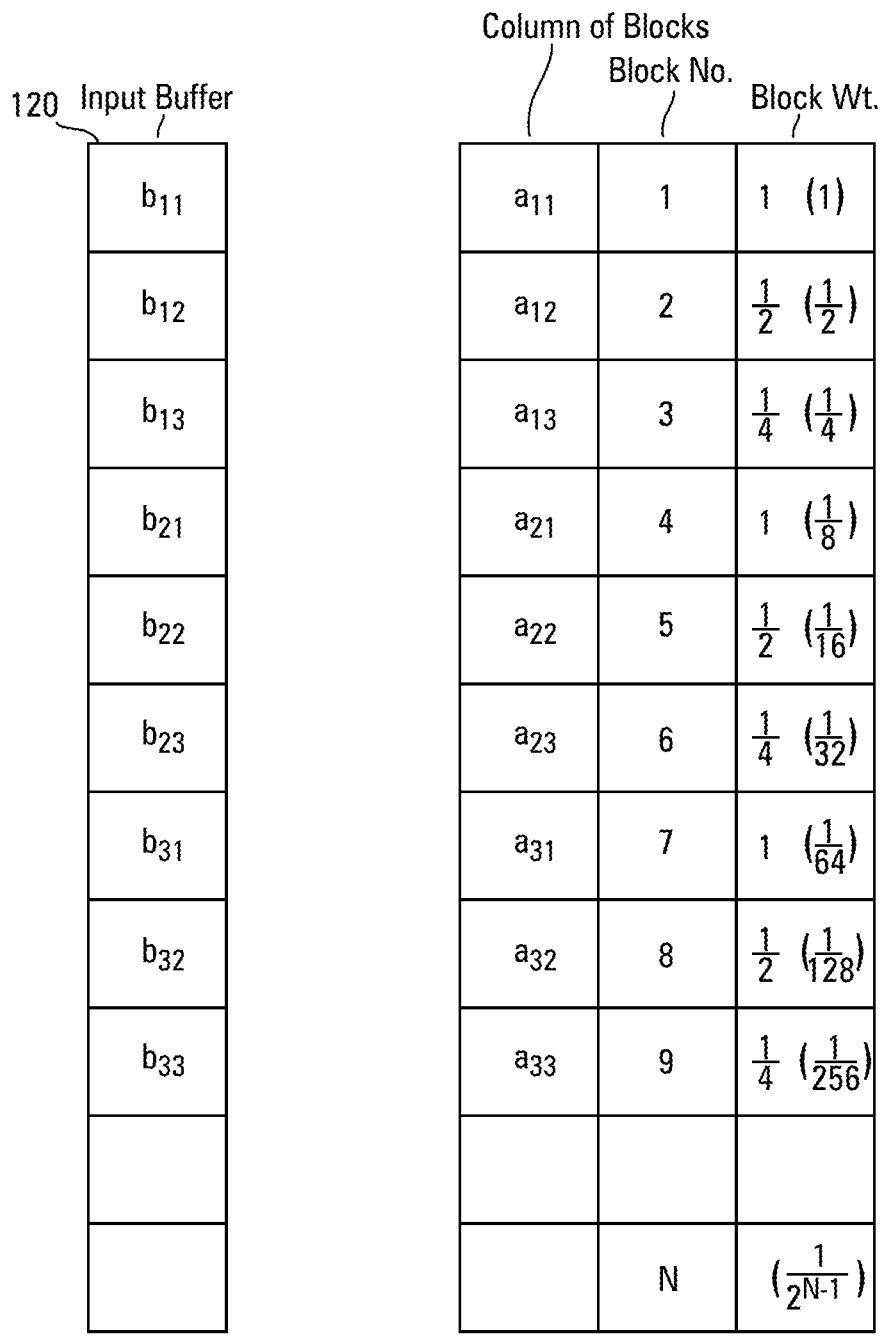
FIG. 5 is an example of how memory blocks might be weighted for comparisons between an input feature vector having multiple components with multiple bits and a data feature vector having multiple components with multiple bits.

FIG. 5 is an example of how memory blocks might be weighted for comparisons between an input feature vector having multiple components with multiple bits and a data feature vector having multiple components with multiple bits. For some embodiments, an input feature vector IF(B) =(B1, B2, B3) may be temporarily stored in input buffer 120. Component B1 may have bits $b_{11}$, $b_{12}$, and $b_{13}$, where the first number in the subscript denotes the component number and the second number in the subscript denotes the bit number, e.g., j. Bits $b_{11}$, $b_{12}$, and $b_{13}$ may be respectively the most significant bit (e.g., bit number j=1), the second-most significant bit (e.g., bit number j=2), and the least significant bit (e.g., bit number j=3) of component B1. Component B2 may have bits $b_{21}$, $b_{22}$, and $b_{23}$. Bits $b_{21}$, $b_{22}$, and $b_{23}$ may be respectively the most significant bit (e.g., bit number j=1), the second-most significant bit (e.g., bit number j=2), and the least significant bit (e.g., bit number j=3) of component B2. Component B3 may have bits $b_{31}$, $b_{32}$, and $b_{23}$. Bits $b_{31}$, $b_{32}$, and $b_{33}$ may be respectively the most significant bit (e.g., bit number j=1), the second-most significant bit (e.g., bit number j=2), and the least significant bit (e.g., bit number j=3) of component B3.

Bits $b_{11}$, $b_{12}$, $b_{13}$, $b_{21}$, $b_{22}$, $b_{23}$, $b_{31}$, $b_{32}$, and $b_{23}$ may be stored in input buffer 120, as shown in FIG. 5. Each of the bits $b_{11}$, $b_{12}$, $b_{13}$, $b_{21}$, $b_{22}$, $b_{23}$, $b_{31}$, $b_{32}$, and $b_{23}$ may use two register bits (e.g., d and d*, FIG. 1C), as described above in conjunction with FIG. 4.

Input feature vector IF(B)=(B1, B2, B3) is to be compared to data feature vector DF(A)=(A1, A2, A3) that is stored in a column of blocks of memory cells in array 204. Component A1 may have bits $a_{11}$, $a_{12}$, and $a_{13}$, where the first number in the subscript denotes the component number and the second number in the subscript denotes the bit number, e.g., j. Bits $a_{11}$, $a_{12}$, and $a_{13}$ may be respectively the most significant bit (e.g., bit number j=1), the second-most significant bit (e.g., bit number j=2), and the least significant bit (e.g., bit number j=3) of component A1. Component A2 may have bits $a_{21}$, $a_{22}$, and $a_{23}$. Bits $a_{21}$, $a_{22}$, and $a_{23}$ may be respectively the most significant bit (e.g., bit number j=1), the second-most significant bit (e.g., bit number j=2), and the least significant bit (e.g., bit number j=3) of component A2. Component A3 may have bits $a_{31}$, $a_{32}$, and $a3_{23}$. Bits $a_{31}$, $a_{32}$, and $a_{33}$ may be respectively the most significant bit (e.g., bit number j=1), the second-most significant bit (e.g., bit number j=2), and the least significant bit (e.g., bit number j=3) of component A3.

Bits $a_{11}$, $a_{12}$, $a_{13}$, $a_{21}$, $a_{22}$, $a_{23}$, $a_{31}$, $a_{32}$, and $a_{23}$ are respectively stored on memory blocks 1 to 9 of the column, as shown in FIG. 5. Each of bits $a_{11}$, $a_{12}$, $a_{13}$, $a_{21}$, $a_{22}$, $a_{23}$, $a_{31}$, $a_{32}$, and $a_{23}$ may use two bits (e.g., z and z*, FIG. 1C) respectively stored in first and second memory cells of a respective block, as described above in conjunction with FIG. 4.

Bits $b_{11}$, $b_{12}$, $b_{13}$, $b_{21}$, $b_{22}$, $b_{23}$, $b_{31}$, $b_{32}$, and $b_{23}$ are to be compared one-to-one to bits $a_{11}$, $a_{12}$, $a_{13}$, $a_{21}$, $a_{22}$, $a_{23}$, $a_{31}$, $a_{32}$, and $a_{23}$. The bits a may be weighted according to their position within a specific component, e.g., according to their bit number j. For example, the weight factor may be $\frac{1}{2}^{j-1}$, starting with j=1 for the most significant bit. Therefore, bits $a_{11}$, $a_{12}$, and $a_{13}$ of component A1 may respectively have weight factors of 1, ½, and ¼; bits $a_{21}$, $a_{22}$, and $a_{23}$ of component A2 may respectively have weight factors of 1, ½, and ¼; and bits $a_{31}$, $a_{32}$, and $a_{33}$ of component A3 may respectively have weight factors of 1, ½, and ¼, as shown in FIG. 5.

Alternatively, the bits a may be weighted according to the block number in which they are stored, e.g., the weight factor may be $\frac{1}{2}^{N-1}$, starting with N=1. Therefore, bits $a_{11}$, $a_{12}$, $a_{13}$, $a_{21}$, $a_{22}$, $a_{23}$, $a_{31}$, $a_{32}$, and $a_{23}$ respectively have weight factors of 1, ½, ¼, ⅛, 1/16, 1/32, 1/64, 1/128, and 1/256, as shown in FIG. 5. Note that for such embodiments, block 1 would store the most significant bit while block N would store the least significant bit.

Although the examples of FIGS. 1-5 were discussed in conjunction with NAND flash, the embodiments described herein are not limited to NAND flash, but can include other flash architectures, such as NOR flash, phase-change memory, resistive RAM, magnetic RAM, etc.

Figure 6:
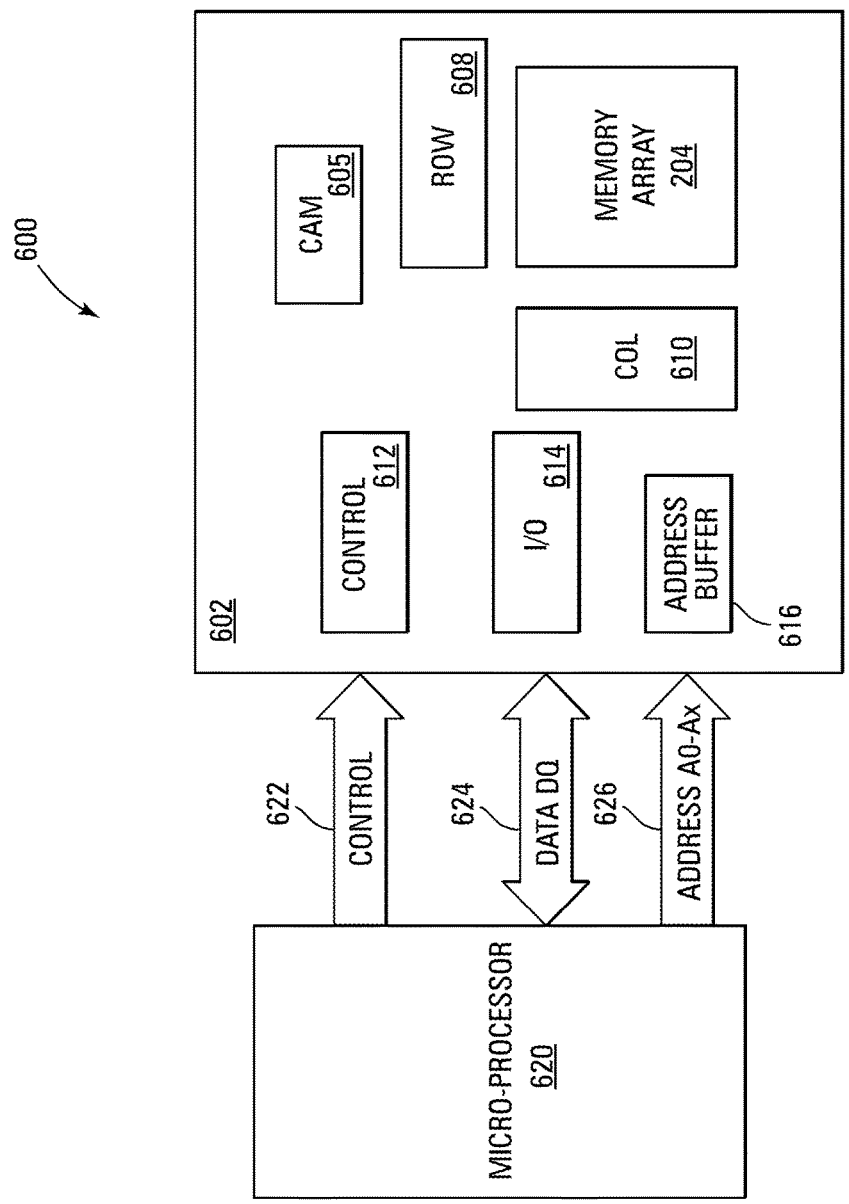
FIG. 6 is a simplified block diagram of a memory system, according to an embodiment.

FIG. 6 is a simplified block diagram of an electronic system, such as a memory system 600, that includes a memory device 602. Memory device 602 may be a flash memory device, e.g., a NAND memory device, NOR memory device, etc. For some embodiments, memory device 602 may be an embodiment of memory device 100 in FIG. 1.

Memory device 602 includes an array of memory cells 204, row access circuitry 608 (e.g., that may include an input buffer, such as input buffer 120 in FIG. 1A), column access circuitry 610 (e.g., that may include a page buffer, such as page buffer 110 in FIG. 1A), control circuitry 612, input/output (I/O) circuitry 614, and an address buffer 616. Memory system 600 includes an external microprocessor 620, such as a memory controller or other external host device, electrically connected to memory device 602 for memory accessing as part of the electronic system. For some embodiments, memory device 602 may be a content addressable memory (CAM) device and may include CAM circuitry 605 that may include registers for receiving input feature vectors, multiplexers, and/or counters, etc.

The memory device 602 receives control signals (which represent commands) from the processor 620 over a control link 622. Memory device 602 receives data signals (which represent data) over a data (DQ) link 624. Address signals (which represent addresses) are received via an address link 626 that are decoded to access the memory array 204. Address buffer circuit 616 latches the address signals. The memory cells in array 204 are accessed in response to the control signals and the address signals.

For some embodiments, control circuitry 612 may be configured to determine whether a input data at least partially matches a data stored in memory array 204, as described above in conjunction with FIGS. 1-5. That is, control circuitry 612 is configured to cause memory device 602 to operate (e.g., to perform the comparisons) as described above in conjunction with FIGS. 1-5.

It will be appreciated by those skilled in the art that additional circuitry and signals can be provided, and that the memory device of FIG. 6 has been simplified. It should be recognized that the functionality of the various block components described with reference to FIG. 6 may not necessarily be segregated to distinct components or component portions of an integrated circuit device. For example, a single component or component portion of memory device 602 could be adapted to perform the functionality of more than one block component of FIG. 6. Alternatively, one or more components or component portions of memory device 602 could be combined to perform the functionality of a single block component of FIG. 6.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory device, comprising:
   comparing input data to data stored in memory cells coupled to a data line;
   comparing a representation of a level of current in the data line to a reference;
   determining that the input data potentially matches the data stored in the memory cells in response to the representation of the level of current in the data line being less than or equal to the reference; and
   determining that the input data does not match the data stored in the memory cells in response to the representation of the level of current in the data line being greater than the reference;

wherein comparing a representation of a level of current in the data line to a reference comprises comparing the representation of the level of current in the data line to a reference that compensates for current leakage through a memory cell coupled to the data line that is turned off.

2. A method of operating a memory device, comprising:

comparing input data to data stored in memory cells coupled to a data line;

comparing a representation of a level of current in the data line to a reference;

deeming the input data to match the data stored in the memory cells in response to the representation of the level of current in the data line being less than the reference; and deeming the input data to not match the data stored in the memory cells in response to the representation of the level of current in the data line being greater than the reference;

wherein comparing a representation of a level of current in the data line to a reference comprises comparing the representation of the level of current in the data line to a reference that compensates for current leakage through a memory cell coupled to the data line that is turned off.

3. A method of operating a memory device, comprising:

comparing input data to data stored in memory cells coupled to a data line;

comparing a representation of a level of current in the data line to a reference;

deeming the input data to match the data stored in the memory cells in response to the representation of the level of current in the data line being less than the reference; and deeming the input data to not match the data stored in the memory cells in response to the representation of the level of current in the data line being greater than the reference; and deeming the input data to match the data stored in the memory cells in response to the representation of the level of current in the data line being equal to the reference.

4. A method of operating a memory device, comprising:

comparing input data to stored data, wherein each digit of stored data is stored in a respective pair of memory cells of a respective string of series-connected memory cells of a plurality of strings of series-connected memory cells coupled to a data line, wherein each digit of the input data corresponds to a respective digit of the stored data, and wherein comparing the input data to the stored data comprises comparing a particular digit of the input data to its respective digit of the stored data by applying a pair of voltages representative of a value of the particular digit of the input data to control gates of the respective pair of memory cells of its respective string of series-connected memory cells;

causing different levels of current to respectively flow through different strings of series-connected memory cells of the plurality of strings of series-connected memory cells from the data line when different digits of the input data respectively mismatch their respective digits of the stored data;

comparing a representation of a level of current in the data line to a reference;

deeming the input data to match the stored data in response to the representation of the level of current in the data line being less than or equal to the reference; and deeming the input data to not match the stored data in response to the representation of the level of current in the data line being greater than the reference;

wherein causing the causing different levels of current to respectively flow through the different strings of series-connected memory cells comprises causing a first level of current to flow through a first string of series-connected memory cells of the plurality of strings of series-connected memory cells and causing a second level of current to flow through a second string of series-connected memory cells of the plurality of strings of series-connected memory cells, wherein the first level of current is a factor of two greater than the second level of current.

5. A method of operating a memory device, comprising:

comparing input data to stored data, wherein each digit of stored data is stored in a respective pair of memory cells of a respective string of series-connected memory cells of a plurality of strings of series-connected memory cells coupled to a data line, wherein each digit of the input data corresponds to a respective digit of the stored data, and wherein comparing the input data to the stored data comprises comparing a particular digit of the input data to its respective digit of the stored data by applying a pair of voltages representative of a value of the particular digit of the input data to control gates of the respective pair of memory cells of its respective string of series-connected memory cells;

comparing a representation of a level of current in the data line to a reference;

deeming the input data to match the stored data in response to the representation of the level of current in the data line being less than or equal to the reference; and deeming the input data to not match the stored data in response to the representation of the level of current in the data line being greater than the reference;

wherein deeming the input data to match the stored data comprises deeming the input data to match the stored data when less than all digits of the input data match their respective digit of the stored data.

* * * * *